US012665546B2

(12) United States Patent
Sella et al.

(10) Patent No.: US 12,665,546 B2
(45) Date of Patent: Jun. 23, 2026

(54) PAIRING OF COMPONENTS IN A DIRECT CURRENT DISTRIBUTED POWER GENERATION SYSTEM

(71) Applicant: Solaredge Technologies Ltd., Herzeliya (IL)

(72) Inventors: Guy Sella, Bitan Aharon (IL); Meir Adest, Modiin (IL); Lior Handelsman, Givatayim (IL); Yoav Galin, Raanana (IL); Amir Fishelov, Tel Aviv (IL); Meir Gazit, Rosh Ha'ayin (IL); Ilan Yoscovich, Givatayim (IL); Yaron Binder, Shoham (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 19/013,668

(22) Filed: Jan. 8, 2025

(65) Prior Publication Data

US 2025/0150032 A1 May 8, 2025

Related U.S. Application Data

(63) Continuation of application No. 18/338,527, filed on Jun. 21, 2023, now Pat. No. 12,224,706, which is a
(Continued)

(51) Int. Cl.
*H02S 50/00* (2014.01)
*H02J 1/10* (2026.01)
(Continued)

(52) U.S. Cl.
CPC ............... *H02S 50/00* (2013.01); *H02J 1/10* (2013.01); *H02J 1/102* (2013.01); *H02S 40/34* (2014.12);
(Continued)

(58) Field of Classification Search
CPC ........ H02S 50/00; H02S 50/34; H10F 77/955; H02J 1/10; H02J 1/102; H02J 2101/24;
(Continued)

(56) References Cited

U.S. PATENT DOCUMENTS

| 2,367,925 A | 1/1945 | Brown |
| 2,586,804 A | 2/1952 | Fluke |
| (Continued) | | |

FOREIGN PATENT DOCUMENTS

| AU | 2073800 A | 9/2000 |
| AU | 2005262278 A1 | 1/2006 |
| (Continued) | | |

OTHER PUBLICATIONS

Storfer, Lior, "Enhancing Cable Modem TCP Performance," Texas Instruments Inc. white paper, Jul. 2003.
(Continued)

*Primary Examiner* — Hal Kaplan
(74) *Attorney, Agent, or Firm* — Banner & Witcoff, Ltd.

(57) ABSTRACT

A method of signaling between a photovoltaic module and an inverter module. The inverter module is connected to the photovoltaic module. In an initial mode of operation an initial code is modulated thereby producing an initial signal. The initial signal is transmitted from the inverter module to the photovoltaic module. The initial signal is received by the photovoltaic module. The operating mode is then changed to a normal mode of power conversion, and during the normal mode of operation a control signal is transmitted from the inverter to the photovoltaic module. A control code is demodulated and received from the control signal. The control code is compared with the initial code producing a comparison. The control command of the control signal is validated as a valid control command from the inverter
(Continued)

module with the control command only acted upon when the comparison is a positive comparison.

28 Claims, 5 Drawing Sheets

Related U.S. Application Data continuation of application No. 17/398,840, filed on Aug. 10, 2021, now Pat. No. 11,728,768, which is a continuation of application No. 15/949,369, filed on Apr. 10, 2018, now Pat. No. 12,316,274, which is a continuation of application No. 14/743,018, filed on Jun. 18, 2015, now Pat. No. 9,960,731, which is a continuation of application No. 13/015,612, filed on Jan. 28, 2011, now Pat. No. 9,112,379.

(51) Int. Cl.

| | |
|---|---|
| *H02J 1/102* | (2026.01) |
| *H02J 3/38* | (2026.01) |
| *H02J 7/35* | (2006.01) |
| *H02J 101/24* | (2026.01) |
| *H02S 40/34* | (2014.01) |
| *H10F 77/00* | (2025.01) |

(52) U.S. Cl.
CPC ............ *H10F 77/955* (2025.01); *H02J 3/381* (2013.01); *H02J 7/35* (2013.01); *H02J 2101/24* (2026.01); *Y02E 10/56* (2013.01); *Y02E 10/76* (2013.01)

(58) Field of Classification Search
CPC .. H02J 3/381; H02J 7/35; Y02E 10/56; Y02E 10/76
USPC ....................................................... 705/14.41
See application file for complete search history.

(56) References Cited

U.S. PATENT DOCUMENTS

| | | | |
|---|---|---|---|
| 2,758,219 | A | 8/1956 | Miller |
| 2,852,721 | A | 9/1958 | Harders et al. |
| 2,958,171 | A | 11/1960 | Deckers |
| 3,369,210 | A | 2/1968 | Manickella |
| 3,380,035 | A | 4/1968 | Hecker |
| 3,392,326 | A | 7/1968 | Lamberton |
| 3,496,029 | A | 2/1970 | King et al. |
| 3,566,143 | A | 2/1971 | Paine et al. |
| 3,569,784 | A | 3/1971 | Carroll et al. |
| 3,643,564 | A | 2/1972 | Uchiyama |
| 3,696,286 | A | 10/1972 | Ule |
| 3,740,652 | A | 6/1973 | Burgener |
| 3,958,136 | A | 5/1976 | Schroeder |
| 3,982,105 | A | 9/1976 | Eberle |
| 4,060,757 | A | 11/1977 | McMurray |
| 4,101,816 | A | 7/1978 | Shepter |
| 4,104,687 | A | 8/1978 | Zulaski |
| 4,127,797 | A | 11/1978 | Perper |
| 4,129,788 | A | 12/1978 | Chavannes |
| 4,129,823 | A | 12/1978 | van der Pool et al. |
| 4,146,785 | A | 3/1979 | Neale |
| 4,161,771 | A | 7/1979 | Bates |
| 4,171,861 | A | 10/1979 | Hohorst |
| 4,183,079 | A | 1/1980 | Wachi |
| 4,253,764 | A | 3/1981 | Morrill |
| 4,257,087 | A | 3/1981 | Cuk |
| 4,296,461 | A | 10/1981 | Mallory et al. |
| 4,321,581 | A | 3/1982 | Tappeiner et al. |
| 4,324,225 | A | 4/1982 | Trihey |
| 4,327,318 | A | 4/1982 | Kwon et al. |
| 4,346,341 | A | 8/1982 | Blackburn et al. |
| 4,363,040 | A | 12/1982 | Inose |
| 4,367,557 | A | 1/1983 | Stern et al. |
| 4,375,662 | A | 3/1983 | Baker |
| 4,384,321 | A | 5/1983 | Rippel |
| 4,404,472 | A | 9/1983 | Steigerwald |
| 4,412,142 | A | 10/1983 | Ragonese et al. |
| 4,452,867 | A | 6/1984 | Conforti |
| 4,453,207 | A | 6/1984 | Paul |
| 4,460,232 | A | 7/1984 | Sotolongo |
| 4,470,213 | A | 9/1984 | Thompson |
| 4,479,175 | A | 10/1984 | Gille et al. |
| 4,481,654 | A | 11/1984 | Daniels et al. |
| 4,488,136 | A | 12/1984 | Hansen et al. |
| 4,526,553 | A | 7/1985 | Guerrero |
| 4,533,986 | A | 8/1985 | Jones |
| 4,545,997 | A | 10/1985 | Wong et al. |
| 4,549,254 | A | 10/1985 | Kissel |
| 4,554,502 | A | 11/1985 | Rohatyn |
| 4,554,515 | A | 11/1985 | Burson et al. |
| 4,580,090 | A | 4/1986 | Bailey et al. |
| 4,591,965 | A | 5/1986 | Dickerson |
| 4,598,330 | A | 7/1986 | Woodworth |
| 4,602,322 | A | 7/1986 | Merrick |
| 4,604,567 | A | 8/1986 | Chetty |
| 4,611,090 | A | 9/1986 | Catella et al. |
| 4,623,753 | A | 11/1986 | Feldman et al. |
| 4,626,983 | A | 12/1986 | Harada et al. |
| 4,631,565 | A | 12/1986 | Tihanyi |
| 4,637,677 | A | 1/1987 | Barkus |
| 4,639,844 | A | 1/1987 | Gallios et al. |
| 4,641,042 | A | 2/1987 | Miyazawa |
| 4,641,079 | A | 2/1987 | Kato et al. |
| 4,644,458 | A | 2/1987 | Harafuji et al. |
| 4,649,334 | A | 3/1987 | Nakajima |
| 4,652,770 | A | 3/1987 | Kumano |
| 4,683,529 | A | 7/1987 | Bucher |
| 4,685,040 | A | 8/1987 | Steigerwald et al. |
| 4,686,617 | A | 8/1987 | Colton |
| 4,706,181 | A | 11/1987 | Mercer |
| 4,719,553 | A | 1/1988 | Hinckley |
| 4,720,667 | A | 1/1988 | Lee et al. |
| 4,720,668 | A | 1/1988 | Lee et al. |
| 4,736,151 | A | 4/1988 | Dishner |
| 4,746,879 | A | 5/1988 | Ma et al. |
| 4,772,994 | A | 9/1988 | Harada et al. |
| 4,783,728 | A | 11/1988 | Hoffman |
| 4,797,803 | A | 1/1989 | Carroll |
| 4,819,121 | A | 4/1989 | Saito et al. |
| RE33,057 | E | 9/1989 | Clegg et al. |
| 4,864,213 | A | 9/1989 | Kido |
| 4,868,379 | A | 9/1989 | West |
| 4,873,480 | A | 10/1989 | Lafferty |
| 4,888,063 | A | 12/1989 | Powell |
| 4,888,702 | A | 12/1989 | Gerken et al. |
| 4,899,246 | A | 2/1990 | Tripodi |
| 4,899,269 | A | 2/1990 | Rouzies |
| 4,903,851 | A | 2/1990 | Slough |
| 4,906,859 | A | 3/1990 | Kobayashi et al. |
| 4,910,518 | A | 3/1990 | Kim et al. |
| 4,951,117 | A | 8/1990 | Kasai |
| 4,978,870 | A | 12/1990 | Chen et al. |
| 4,987,360 | A | 1/1991 | Thompson |
| 5,001,415 | A | 3/1991 | Watkinson |
| 5,027,051 | A | 6/1991 | Lafferty |
| 5,027,059 | A | 6/1991 | de Montgolfier et al. |
| 5,041,739 | A | 8/1991 | Goto |
| 5,045,988 | A | 9/1991 | Gritter et al. |
| 5,054,023 | A | 10/1991 | Kronberg |
| 5,081,558 | A | 1/1992 | Mahler |
| 5,097,196 | A | 3/1992 | Schoneman |
| 5,138,422 | A | 8/1992 | Fujii et al. |
| 5,143,556 | A | 9/1992 | Matlin |
| 5,144,222 | A | 9/1992 | Herbert |
| 5,155,670 | A | 10/1992 | Brian |
| 5,191,519 | A | 3/1993 | Kawakami |
| 5,196,781 | A | 3/1993 | Jamieson et al. |
| 5,210,519 | A | 5/1993 | Moore |
| 5,235,266 | A | 8/1993 | Schaffrin |
| 5,237,194 | A | 8/1993 | Takahashi |
| 5,268,832 | A | 12/1993 | Kandatsu |

(56)                    References Cited

U.S. PATENT DOCUMENTS

| | | |
|---|---|---|
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loffler |
| 5,412,558 A | 5/1995 | Sakurai et al. |
| 5,413,313 A | 5/1995 | Mutterlein et al. |
| 5,428,286 A | 6/1995 | Kha |
| 5,446,645 A | 8/1995 | Shirahama et al. |
| 5,460,546 A | 10/1995 | Kunishi et al. |
| 5,472,614 A | 12/1995 | Rossi |
| 5,475,296 A | 12/1995 | Vinsant et al. |
| 5,477,091 A | 12/1995 | Fiorina et al. |
| 5,493,154 A | 2/1996 | Smith et al. |
| 5,497,289 A | 3/1996 | Sugishima et al. |
| 5,501,083 A | 3/1996 | Kim |
| 5,504,415 A | 4/1996 | Podrazhansky et al. |
| 5,504,418 A | 4/1996 | Ashley |
| 5,504,449 A | 4/1996 | Prentice |
| 5,513,075 A | 4/1996 | Capper et al. |
| 5,517,378 A | 5/1996 | Asplund et al. |
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,566,022 A | 10/1996 | Segev |
| 5,576,941 A | 11/1996 | Nguyen et al. |
| 5,580,395 A | 12/1996 | Yoshioka et al. |
| 5,585,749 A | 12/1996 | Pace et al. |
| 5,604,430 A | 2/1997 | Decker et al. |
| 5,616,913 A | 4/1997 | Litterst |
| 5,625,539 A | 4/1997 | Nakata et al. |
| 5,631,534 A | 5/1997 | Lewis |
| 5,636,107 A | 6/1997 | Lu et al. |
| 5,644,212 A | 7/1997 | Takahashi |
| 5,644,219 A | 7/1997 | Kurokawa |
| 5,646,501 A | 7/1997 | Fishman et al. |
| 5,648,731 A | 7/1997 | Decker et al. |
| 5,654,740 A | 8/1997 | Schulha |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,696,439 A | 12/1997 | Presti et al. |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,258 A | 3/1998 | Esser |
| 5,734,259 A | 3/1998 | Sisson et al. |
| 5,734,565 A | 3/1998 | Mueller et al. |
| 5,747,967 A | 5/1998 | Muljadi et al. |
| 5,751,120 A | 5/1998 | Zeitler et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spee et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,955,885 A | 9/1999 | Kurokami et al. |
| 5,959,438 A | 9/1999 | Jovanovic et al. |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,008,971 A | 12/1999 | Duba et al. |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,091,329 A | 7/2000 | Newman |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,127,801 A | 10/2000 | Manor |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,191,498 B1 | 2/2001 | Chang |
| 6,215,286 B1 | 4/2001 | Scoones et al. |
| 6,219,623 B1 | 4/2001 | Wills |
| 6,222,351 B1 | 4/2001 | Fontanella et al. |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |

(56)　　　　References Cited

U.S. PATENT DOCUMENTS

| | | |
|---|---|---|
| 6,274,804 B1 | 8/2001 | Psyk et al. |
| 6,275,016 B1 | 8/2001 | Ivanov |
| 6,281,485 B1 | 8/2001 | Siri |
| 6,285,572 B1 | 9/2001 | Onizuka et al. |
| 6,291,764 B1 | 9/2001 | Ishida et al. |
| 6,292,379 B1 | 9/2001 | Edevold et al. |
| 6,297,621 B1 | 10/2001 | Hui et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,329,808 B1 | 12/2001 | Enguent |
| 6,331,670 B2 | 12/2001 | Takehara et al. |
| 6,339,538 B1 | 1/2002 | Handleman |
| 6,344,612 B1 | 2/2002 | Kuwahara et al. |
| 6,346,451 B1 | 2/2002 | Simpson et al. |
| 6,348,781 B1 | 2/2002 | Midya et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |
| 6,400,579 B2 | 6/2002 | Cuk |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |
| 6,448,489 B2 | 9/2002 | Kimura et al. |
| 6,452,362 B1 | 9/2002 | Choo |
| 6,452,814 B1 | 9/2002 | Wittenbreder |
| 6,465,910 B2 | 10/2002 | Young et al. |
| 6,465,931 B2 | 10/2002 | Knowles et al. |
| 6,469,919 B1 | 10/2002 | Bennett |
| 6,472,254 B2 | 10/2002 | Cantarini et al. |
| 6,479,963 B1 | 11/2002 | Manor et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,512,444 B1 | 1/2003 | Morris, Jr. et al. |
| 6,515,215 B1 | 2/2003 | Mimura |
| 6,515,217 B1 | 2/2003 | Aylaian |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,600,100 B2 | 7/2003 | Ho et al. |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,636,431 B2 | 10/2003 | Seki et al. |
| 6,650,031 B1 | 11/2003 | Goldack |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,657,419 B2 | 12/2003 | Renyolds |
| 6,664,762 B2 | 12/2003 | Kutkut |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,708,507 B1 | 3/2004 | Sem et al. |
| 6,709,291 B1 | 3/2004 | Wallace et al. |
| 6,724,593 B1 | 4/2004 | Smith |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,503 B2 | 12/2004 | Yoshikawa et al. |
| 6,828,901 B2 | 12/2004 | Birchfield et al. |
| 6,835,491 B2 | 12/2004 | Gartstein et al. |
| 6,837,739 B2 | 1/2005 | Gorringe et al. |
| 6,838,611 B2 | 1/2005 | Kondo et al. |
| 6,838,856 B2 | 1/2005 | Raichle |
| 6,842,354 B1 | 1/2005 | Tallam et al. |
| 6,844,739 B2 | 1/2005 | Kasai et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,894,911 B2 | 5/2005 | Telefus et al. |
| 6,897,370 B2 | 5/2005 | Kondo et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,970,365 B2 | 11/2005 | Turchi |
| 6,980,783 B2 | 12/2005 | Liu et al. |
| 6,984,967 B2 | 1/2006 | Notman |
| 6,984,970 B2 | 1/2006 | Capel |
| 6,985,967 B1 | 1/2006 | Hipp |
| 6,987,444 B2 | 1/2006 | Bub et al. |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,039,941 B1 | 5/2006 | Caporizzo et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,088,595 B2 | 8/2006 | Nino |
| 7,089,780 B2 | 8/2006 | Sunshine et al. |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |

(56)  References Cited

U.S. PATENT DOCUMENTS

| | | | |
|---|---|---|---|
| 7,126,294 | B2 | 10/2006 | Minami et al. |
| 7,138,786 | B2 | 11/2006 | Ishigaki et al. |
| 7,142,997 | B1 | 11/2006 | Widner |
| 7,148,669 | B2 | 12/2006 | Maksimovic et al. |
| 7,150,938 | B2 | 12/2006 | Munshi et al. |
| 7,157,888 | B2 | 1/2007 | Chen et al. |
| 7,158,359 | B2 | 1/2007 | Bertele et al. |
| 7,158,395 | B2 | 1/2007 | Deng et al. |
| 7,161,082 | B2 | 1/2007 | Matsushita et al. |
| 7,174,973 | B1 | 2/2007 | Lysaght |
| 7,176,667 | B2 | 2/2007 | Chen et al. |
| 7,183,667 | B2 | 2/2007 | Colby et al. |
| 7,193,872 | B2 | 3/2007 | Siri |
| 7,202,653 | B2 | 4/2007 | Pai |
| 7,208,674 | B2 | 4/2007 | Aylaian |
| 7,218,541 | B2 | 5/2007 | Price et al. |
| 7,248,946 | B2 | 7/2007 | Bashaw et al. |
| 7,256,566 | B2 | 8/2007 | Bhavaraju et al. |
| 7,259,474 | B2 | 8/2007 | Blanc |
| 7,262,979 | B2 | 8/2007 | Wai et al. |
| 7,276,886 | B2 | 10/2007 | Kinder et al. |
| 7,277,304 | B2 | 10/2007 | Stancu et al. |
| 7,281,141 | B2 | 10/2007 | Elkayam et al. |
| 7,282,814 | B2 | 10/2007 | Jacobs |
| 7,282,924 | B1 | 10/2007 | Wittner |
| 7,291,036 | B1 | 11/2007 | Daily et al. |
| 7,298,113 | B2 | 11/2007 | Orikasa |
| RE39,976 | E | 1/2008 | Schiff et al. |
| 7,315,052 | B2 | 1/2008 | Alter |
| 7,319,313 | B2 | 1/2008 | Dickerson et al. |
| 7,324,361 | B2 | 1/2008 | Siri |
| 7,336,004 | B2 | 2/2008 | Lai |
| 7,336,056 | B1 | 2/2008 | Dening |
| 7,339,287 | B2 | 3/2008 | Jepsen et al. |
| 7,348,802 | B2 | 3/2008 | Kasanyal et al. |
| 7,352,154 | B2 | 4/2008 | Cook |
| 7,361,952 | B2 | 4/2008 | Miura et al. |
| 7,371,963 | B2 | 5/2008 | Suenaga et al. |
| 7,372,712 | B2 | 5/2008 | Stancu et al. |
| 7,385,380 | B2 | 6/2008 | Ishigaki et al. |
| 7,385,833 | B2 | 6/2008 | Keung |
| 7,388,348 | B2 | 6/2008 | Mattichak |
| 7,391,190 | B1 | 6/2008 | Rajagopalan |
| 7,394,237 | B2 | 7/2008 | Chou et al. |
| 7,405,117 | B2 | 7/2008 | Zuniga et al. |
| 7,414,870 | B2 | 8/2008 | Rottger et al. |
| 7,420,354 | B2 | 9/2008 | Cutler |
| 7,420,815 | B2 | 9/2008 | Love |
| 7,432,691 | B2 | 10/2008 | Cutler |
| 7,435,134 | B2 | 10/2008 | Lenox |
| 7,435,897 | B2 | 10/2008 | Russell |
| 7,443,052 | B2 | 10/2008 | Wendt et al. |
| 7,443,152 | B2 | 10/2008 | Utsunomiya |
| 7,450,401 | B2 | 11/2008 | Tida |
| 7,456,510 | B2 | 11/2008 | Ito et al. |
| 7,456,523 | B2 | 11/2008 | Kobayashi |
| 7,463,500 | B2 | 12/2008 | West |
| 7,466,566 | B2 | 12/2008 | Fukumoto |
| 7,471,014 | B2 | 12/2008 | Lum et al. |
| 7,471,524 | B1 | 12/2008 | Batarseh et al. |
| 7,479,774 | B2 | 1/2009 | Wai et al. |
| 7,482,238 | B2 | 1/2009 | Sung |
| 7,485,987 | B2 | 2/2009 | Mori et al. |
| 7,495,419 | B1 | 2/2009 | Ju |
| 7,504,811 | B2 | 3/2009 | Watanabe et al. |
| 7,518,346 | B2 | 4/2009 | Prexl et al. |
| 7,538,451 | B2 | 5/2009 | Nomoto |
| 7,560,915 | B2 | 7/2009 | Ito et al. |
| 7,589,437 | B2 | 9/2009 | Henne et al. |
| 7,595,616 | B2 | 9/2009 | Prexl et al. |
| 7,596,008 | B2 | 9/2009 | Iwata et al. |
| 7,599,200 | B2 | 10/2009 | Tomonaga |
| 7,600,349 | B2 | 10/2009 | Liebendorfer |
| 7,602,080 | B1 | 10/2009 | Hadar et al. |
| 7,602,626 | B2 | 10/2009 | Iwata et al. |
| 7,605,498 | B2 | 10/2009 | Ledenev et al. |
| 7,612,283 | B2 | 11/2009 | Toyomura et al. |
| 7,615,981 | B2 | 11/2009 | Wong et al. |
| 7,626,834 | B2 | 12/2009 | Chisenga et al. |
| 7,634,667 | B2 | 12/2009 | Weaver et al. |
| 7,646,116 | B2 | 1/2010 | Batarseh et al. |
| 7,649,434 | B2 | 1/2010 | Xu et al. |
| 7,659,701 | B1 | 2/2010 | Metsker et al. |
| 7,701,083 | B2 | 4/2010 | Savage |
| 7,709,727 | B2 | 5/2010 | Roehrig et al. |
| 7,719,140 | B2 | 5/2010 | Ledenev et al. |
| 7,723,865 | B2 | 5/2010 | Kitanaka |
| 7,733,069 | B2 | 6/2010 | Toyomura et al. |
| 7,748,175 | B2 | 7/2010 | Liebendorfer |
| 7,759,575 | B2 | 7/2010 | Jones et al. |
| 7,763,807 | B2 | 7/2010 | Richter |
| 7,772,716 | B2 | 8/2010 | Shaver et al. |
| 7,777,570 | B2 | 8/2010 | Lai |
| 7,780,472 | B2 | 8/2010 | Lenox |
| 7,782,031 | B2 | 8/2010 | Qiu et al. |
| 7,783,389 | B2 | 8/2010 | Yamada et al. |
| 7,787,273 | B2 | 8/2010 | Lu et al. |
| 7,804,282 | B2 | 9/2010 | Bertele |
| 7,807,919 | B2 | 10/2010 | Powell et al. |
| 7,808,125 | B1 | 10/2010 | Sachdeva et al. |
| 7,812,592 | B2 | 10/2010 | Prior et al. |
| 7,812,701 | B2 | 10/2010 | Lee et al. |
| 7,821,225 | B2 | 10/2010 | Chou et al. |
| 7,824,189 | B1 | 11/2010 | Lauermann et al. |
| 7,839,022 | B2 | 11/2010 | Wolfs |
| 7,843,085 | B2 | 11/2010 | Ledenev et al. |
| 7,864,497 | B2 | 1/2011 | Quardt et al. |
| 7,868,599 | B2 | 1/2011 | Rahman et al. |
| 7,880,334 | B2 | 2/2011 | Evans et al. |
| 7,883,808 | B2 | 2/2011 | Norimatsu et al. |
| 7,884,278 | B2 | 2/2011 | Powell et al. |
| 7,893,346 | B2 | 2/2011 | Nachamkin et al. |
| 7,898,112 | B2 | 3/2011 | Powell et al. |
| 7,900,361 | B2 | 3/2011 | Adest et al. |
| 7,906,007 | B2 | 3/2011 | Gibson et al. |
| 7,906,870 | B2 | 3/2011 | Ohm |
| 7,919,952 | B1 | 4/2011 | Fahrenbruch |
| 7,919,953 | B2 | 4/2011 | Porter et al. |
| 7,925,552 | B2 | 4/2011 | Tarbell et al. |
| 7,944,191 | B2 | 5/2011 | Xu |
| 7,945,413 | B2 | 5/2011 | Krein |
| 7,948,221 | B2 | 5/2011 | Watanabe et al. |
| 7,952,897 | B2 | 5/2011 | Nocentini et al. |
| 7,960,650 | B2 | 6/2011 | Richter et al. |
| 7,960,950 | B2 | 6/2011 | Glovinsky |
| 7,962,249 | B1 | 6/2011 | Zhang et al. |
| 7,969,043 | B2 | 6/2011 | Caraghiorghiopol et al. |
| 7,969,133 | B2 | 6/2011 | Zhang et al. |
| 7,977,810 | B2 | 7/2011 | Choi et al. |
| 8,003,885 | B2 | 8/2011 | Richter et al. |
| 8,004,113 | B2 | 8/2011 | Sander et al. |
| 8,004,116 | B2 | 8/2011 | Ledenev et al. |
| 8,004,117 | B2 | 8/2011 | Adest et al. |
| 8,004,237 | B2 | 8/2011 | Manor et al. |
| 8,004,866 | B2 | 8/2011 | Bucella et al. |
| 8,013,472 | B2 | 9/2011 | Adest et al. |
| 8,018,748 | B2 | 9/2011 | Leonard |
| 8,035,249 | B2 | 10/2011 | Shaver, II et al. |
| 8,039,730 | B2 | 10/2011 | Hadar et al. |
| 8,049,363 | B2 | 11/2011 | McLean et al. |
| 8,050,804 | B2 | 11/2011 | Kernahan |
| 8,058,747 | B2 | 11/2011 | Avrutsky et al. |
| 8,058,752 | B2 | 11/2011 | Erickson, Jr. et al. |
| 8,067,855 | B2 | 11/2011 | Mumtaz et al. |
| 8,077,437 | B2 | 12/2011 | Mumtaz et al. |
| 8,080,986 | B2 | 12/2011 | Lai et al. |
| 8,089,780 | B2 | 1/2012 | Mochikawa et al. |
| 8,089,785 | B2 | 1/2012 | Rodriguez |
| 8,090,548 | B2 | 1/2012 | Abdennadher et al. |
| 8,093,756 | B2 | 1/2012 | Porter et al. |
| 8,093,757 | B2 | 1/2012 | Wolfs |
| 8,097,818 | B2 | 1/2012 | Gerull et al. |
| 8,098,055 | B2 | 1/2012 | Avrutsky et al. |
| 8,102,074 | B2 | 1/2012 | Hadar et al. |

(56)        References Cited

U.S. PATENT DOCUMENTS

| | | | |
|---|---|---|---|
| 8,102,144 | B2 | 1/2012 | Capp et al. |
| 8,111,052 | B2 | 2/2012 | Glovinsky |
| 8,116,103 | B2 | 2/2012 | Zacharias et al. |
| 8,138,631 | B2 | 3/2012 | Allen et al. |
| 8,138,914 | B2 | 3/2012 | Wong et al. |
| 8,139,335 | B2 | 3/2012 | Quardt et al. |
| 8,139,382 | B2 | 3/2012 | Zhang et al. |
| 8,148,849 | B2 | 4/2012 | Zanarini et al. |
| 8,158,877 | B2 | 4/2012 | Klein et al. |
| 8,169,252 | B2 | 5/2012 | Fahrenbruch et al. |
| 8,179,147 | B2 | 5/2012 | Dargatz et al. |
| 8,184,460 | B2 | 5/2012 | O'Brien et al. |
| 8,188,610 | B2 | 5/2012 | Scholte-Wassink |
| 8,204,709 | B2 | 6/2012 | Presher, Jr. et al. |
| 8,212,408 | B2 | 7/2012 | Fishman |
| 8,212,409 | B2 | 7/2012 | Bettenwort et al. |
| 8,232,790 | B2 | 7/2012 | Leong et al. |
| 8,233,301 | B1 | 7/2012 | Guo |
| 8,248,804 | B2 | 8/2012 | Han et al. |
| 8,271,599 | B2 | 9/2012 | Eizips et al. |
| 8,274,172 | B2 | 9/2012 | Hadar et al. |
| 8,279,644 | B2 | 10/2012 | Zhang et al. |
| 8,284,574 | B2 | 10/2012 | Chapman et al. |
| 8,289,183 | B1 | 10/2012 | Foss |
| 8,289,742 | B2 | 10/2012 | Adest et al. |
| 8,294,451 | B2 | 10/2012 | Hasenfus |
| 8,299,757 | B2 | 10/2012 | Yamauchi et al. |
| 8,299,773 | B2 | 10/2012 | Jang et al. |
| 8,304,932 | B2 | 11/2012 | Ledenev et al. |
| 8,310,101 | B2 | 11/2012 | Amaratunga et al. |
| 8,310,102 | B2 | 11/2012 | Raju |
| 8,314,375 | B2 | 11/2012 | Arditi et al. |
| 8,319,471 | B2 | 11/2012 | Adest et al. |
| 8,324,921 | B2 | 12/2012 | Adest et al. |
| 8,325,059 | B2 | 12/2012 | Rozenboim |
| 8,344,548 | B2 | 1/2013 | Stern |
| 8,355,563 | B2 | 1/2013 | Kasahara et al. |
| 8,369,113 | B2 | 2/2013 | Rodriguez |
| 8,378,656 | B2 | 2/2013 | de Rooij et al. |
| 8,379,418 | B2 | 2/2013 | Falk |
| 8,391,031 | B2 | 3/2013 | Garrity |
| 8,391,032 | B2 | 3/2013 | Garrity et al. |
| 8,395,366 | B2 | 3/2013 | Uno |
| 8,405,248 | B2 | 3/2013 | Mumtaz et al. |
| 8,405,349 | B2 | 3/2013 | Kikinis et al. |
| 8,405,367 | B2 | 3/2013 | Chisenga et al. |
| 8,410,359 | B2 | 4/2013 | Richter |
| 8,410,889 | B2 | 4/2013 | Garrity et al. |
| 8,410,950 | B2 | 4/2013 | Takehara et al. |
| 8,415,552 | B2 | 4/2013 | Hadar et al. |
| 8,415,937 | B2 | 4/2013 | Hester |
| 8,427,009 | B2 | 4/2013 | Shaver, II et al. |
| 8,436,592 | B2 | 5/2013 | Saitoh |
| 8,461,809 | B2 | 6/2013 | Rodriguez |
| 8,466,789 | B2 | 6/2013 | Muhlberger et al. |
| 8,472,220 | B2 | 6/2013 | Garrity et al. |
| 8,473,250 | B2 | 6/2013 | Adest et al. |
| 8,509,032 | B2 | 8/2013 | Rakib |
| 8,526,205 | B2 | 9/2013 | Garrity |
| 8,531,055 | B2 | 9/2013 | Adest et al. |
| 8,542,512 | B2 | 9/2013 | Garrity |
| 8,570,017 | B2 | 10/2013 | Perichon et al. |
| 8,581,441 | B2 | 11/2013 | Rotzoll et al. |
| 8,587,151 | B2 | 11/2013 | Adest et al. |
| 8,618,692 | B2 | 12/2013 | Adest et al. |
| 8,624,443 | B2 | 1/2014 | Mumtaz |
| 8,653,689 | B2 | 2/2014 | Rozenboim |
| 8,669,675 | B2 | 3/2014 | Capp et al. |
| 8,670,255 | B2 | 3/2014 | Gong et al. |
| 8,674,548 | B2 | 3/2014 | Mumtaz |
| 8,674,668 | B2 | 3/2014 | Chisenga et al. |
| 8,686,333 | B2 | 4/2014 | Arditi et al. |
| 8,710,351 | B2 | 4/2014 | Robbins |
| 8,751,053 | B2 | 6/2014 | Hadar et al. |
| 8,773,236 | B2 | 7/2014 | Makhota et al. |
| 8,791,598 | B2 | 7/2014 | Jain |
| 8,796,884 | B2 | 8/2014 | Naiknaware et al. |
| 8,809,699 | B2 | 8/2014 | Funk |
| 8,811,047 | B2 | 8/2014 | Rodriguez |
| 8,816,535 | B2 | 8/2014 | Adest et al. |
| 8,823,212 | B2 | 9/2014 | Garrity et al. |
| 8,823,218 | B2 | 9/2014 | Hadar et al. |
| 8,823,342 | B2 | 9/2014 | Williams |
| 8,835,748 | B2 | 9/2014 | Frolov et al. |
| 8,841,916 | B2 | 9/2014 | Avrutsky |
| 8,842,397 | B2 | 9/2014 | Fahrenbruch et al. |
| 8,853,886 | B2 | 10/2014 | Avrutsky et al. |
| 8,854,193 | B2 | 10/2014 | Makhota et al. |
| 8,859,884 | B2 | 10/2014 | Dunton et al. |
| 8,860,241 | B2 | 10/2014 | Hadar et al. |
| 8,860,246 | B2 | 10/2014 | Hadar et al. |
| 8,872,439 | B2 | 10/2014 | Cohen |
| 8,878,563 | B2 | 11/2014 | Robbins |
| 8,917,156 | B2 | 12/2014 | Garrity et al. |
| 8,922,061 | B2 | 12/2014 | Arditi |
| 8,933,321 | B2 | 1/2015 | Hadar et al. |
| 8,934,269 | B2 | 1/2015 | Garrity |
| 8,947,194 | B2 | 2/2015 | Sella et al. |
| 8,963,375 | B2 | 2/2015 | DeGraaff |
| 8,963,378 | B1 | 2/2015 | Fornage et al. |
| 8,963,501 | B2 | 2/2015 | Shigemizu et al. |
| 8,963,518 | B2 | 2/2015 | Wolfs |
| 8,972,765 | B1 | 3/2015 | Krolak et al. |
| 9,010,645 | B2 | 4/2015 | Arnouse |
| 9,041,339 | B2 | 5/2015 | Adest et al. |
| 9,088,178 | B2 | 7/2015 | Adest et al. |
| 9,130,401 | B2 | 9/2015 | Adest et al. |
| 9,142,965 | B2 | 9/2015 | Grana |
| 9,257,848 | B2 | 2/2016 | Coccia et al. |
| 9,291,696 | B2 | 3/2016 | Adest et al. |
| 9,362,743 | B2 | 6/2016 | Gazit et al. |
| 9,397,497 | B2 | 7/2016 | Ledenev |
| 9,401,664 | B2 | 7/2016 | Perreault et al. |
| 9,407,161 | B2 | 8/2016 | Adest et al. |
| 9,466,737 | B2 | 10/2016 | Ledenev |
| 9,577,454 | B2 | 2/2017 | Seymour et al. |
| 9,647,442 | B2 | 5/2017 | Yoscovich et al. |
| 9,660,527 | B2 | 5/2017 | Glovinski |
| 9,673,630 | B2 | 6/2017 | Ledenev et al. |
| 9,819,178 | B2 | 11/2017 | Gazit et al. |
| 9,831,916 | B2 | 11/2017 | Behrends |
| 9,843,193 | B2 | 12/2017 | Getsla |
| 9,853,490 | B2 | 12/2017 | Adest et al. |
| 9,865,411 | B2 | 1/2018 | Friebe et al. |
| 9,869,701 | B2 | 1/2018 | Sella et al. |
| 9,923,516 | B2 | 3/2018 | Har-Shai et al. |
| 9,991,717 | B1 | 6/2018 | Rowe et al. |
| 9,995,796 | B1 | 6/2018 | Johnson |
| 10,032,939 | B2 | 7/2018 | Ledenev et al. |
| 10,256,770 | B2 | 4/2019 | Hadar et al. |
| 10,432,139 | B2 | 10/2019 | Chaintreuil et al. |
| 10,457,159 | B1 | 10/2019 | Castelaz et al. |
| 10,666,045 | B2 | 5/2020 | Gemin et al. |
| 10,673,253 | B2 | 6/2020 | Adest et al. |
| 10,931,119 | B2 | 2/2021 | Har-Shai et al. |
| 10,969,412 | B2 | 4/2021 | Sella et al. |
| 11,018,623 | B2 | 5/2021 | Loewenstern et al. |
| 11,205,946 | B2 | 12/2021 | Yoscovich et al. |
| 11,276,786 | B2 | 3/2022 | Hopf et al. |
| 11,476,799 | B2 | 10/2022 | Sella et al. |
| 11,682,918 | B2 | 6/2023 | Adest et al. |
| 11,728,724 | B2 | 8/2023 | Braginsky et al. |
| 2001/0000957 | A1 | 5/2001 | Birchfield et al. |
| 2001/0011881 | A1 | 8/2001 | Emori et al. |
| 2001/0013767 | A1 | 8/2001 | Takemoto |
| 2001/0023703 | A1 | 9/2001 | Kondo et al. |
| 2001/0032664 | A1 | 10/2001 | Takehara et al. |
| 2001/0034982 | A1 | 11/2001 | Nagao et al. |
| 2001/0035180 | A1 | 11/2001 | Kimura et al. |
| 2001/0048605 | A1 | 12/2001 | Kurokami et al. |
| 2001/0050102 | A1 | 12/2001 | Matsumi et al. |
| 2001/0054881 | A1 | 12/2001 | Watanabe |
| 2002/0002040 | A1 | 1/2002 | Kline et al. |
| 2002/0014262 | A1 | 2/2002 | Matsushita et al. |

(56) References Cited

U.S. PATENT DOCUMENTS

| | | |
|---|---|---|
| 2002/0017900 A1 | 2/2002 | Takeda et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0059035 A1 | 5/2002 | Yagi et al. |
| 2002/0063552 A1 | 5/2002 | Arakawa |
| 2002/0063625 A1 | 5/2002 | Takehara et al. |
| 2002/0078991 A1 | 6/2002 | Nagao et al. |
| 2002/0080027 A1 | 6/2002 | Conley |
| 2002/0085397 A1 | 7/2002 | Suzui et al. |
| 2002/0105765 A1 | 8/2002 | Kondo et al. |
| 2002/0113689 A1 | 8/2002 | Gehlot et al. |
| 2002/0118559 A1 | 8/2002 | Kurokami et al. |
| 2002/0127980 A1 | 9/2002 | Amanullah et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0162585 A1 | 11/2002 | Sugawara et al. |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2002/0190696 A1 | 12/2002 | Darshan |
| 2003/0001709 A1 | 1/2003 | Visser |
| 2003/0002303 A1 | 1/2003 | Riggio et al. |
| 2003/0025594 A1 | 2/2003 | Akiyama et al. |
| 2003/0038615 A1 | 2/2003 | Elbanhawy |
| 2003/0043597 A1 | 3/2003 | Betts-LaCroix |
| 2003/0047207 A1 | 3/2003 | Aylaian |
| 2003/0058593 A1 | 3/2003 | Bertele et al. |
| 2003/0058662 A1 | 3/2003 | Baudelot et al. |
| 2003/0062078 A1 | 4/2003 | Mimura |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | LeRow et al. |
| 2003/0085621 A1 | 5/2003 | Potega |
| 2003/0090233 A1 | 5/2003 | Browe |
| 2003/0090246 A1 | 5/2003 | Shenai et al. |
| 2003/0094931 A1 | 5/2003 | Renyolds |
| 2003/0098056 A1 | 5/2003 | Fronek et al. |
| 2003/0107352 A1 | 6/2003 | Downer et al. |
| 2003/0111103 A1 | 6/2003 | Bower et al. |
| 2003/0116154 A1 | 6/2003 | Butler et al. |
| 2003/0121514 A1 | 7/2003 | Davenport et al. |
| 2003/0127126 A1 | 7/2003 | Yang |
| 2003/0140960 A1 | 7/2003 | Baum et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0206424 A1 | 11/2003 | Jungreis et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0027101 A1 | 2/2004 | Vinciarelli et al. |
| 2004/0027112 A1 | 2/2004 | Kondo et al. |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0141345 A1 | 7/2004 | Cheng et al. |
| 2004/0144043 A1 | 7/2004 | Stevenson et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0167676 A1 | 8/2004 | Mizumaki |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211456 A1 | 10/2004 | Brown et al. |
| 2004/0211458 A1 | 10/2004 | Gui et al. |
| 2004/0211459 A1 | 10/2004 | Suenaga et al. |
| 2004/0213169 A1 | 10/2004 | Allard et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0255999 A1 | 12/2004 | Matsushita et al. |
| 2004/0258141 A1 | 12/2004 | Tustison et al. |
| 2004/0262998 A1 | 12/2004 | Kunow et al. |
| 2004/0263119 A1 | 12/2004 | Meyer et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0041442 A1 | 2/2005 | Balakrishnan |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0077879 A1 | 4/2005 | Near |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0109386 A1 | 5/2005 | Marshall |
| 2005/0110454 A1 | 5/2005 | Tsai et al. |
| 2005/0121067 A1 | 6/2005 | Toyomura et al. |
| 2005/0122747 A1 | 6/2005 | Gaksch |
| 2005/0135031 A1 | 6/2005 | Colby et al. |
| 2005/0139258 A1 | 6/2005 | Liu et al. |
| 2005/0140335 A1 | 6/2005 | Lee et al. |
| 2005/0162018 A1 | 7/2005 | Realmuto et al. |
| 2005/0163063 A1 | 7/2005 | Kuchler et al. |
| 2005/0172995 A1 | 8/2005 | Rohrig et al. |
| 2005/0179420 A1 | 8/2005 | Satoh et al. |
| 2005/0191528 A1 | 9/2005 | Cortes et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0218876 A1 | 10/2005 | Nino |
| 2005/0225090 A1 | 10/2005 | Wobben |
| 2005/0226017 A1 | 10/2005 | Kotsopoulos et al. |
| 2005/0231183 A1 | 10/2005 | Li et al. |
| 2005/0242795 A1 | 11/2005 | Al-Kuran et al. |
| 2005/0248428 A1 | 11/2005 | Coleman et al. |
| 2005/0252545 A1 | 11/2005 | Nowlan et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2005/0286510 A1 | 12/2005 | Nakajima et al. |
| 2005/0287402 A1 | 12/2005 | Maly et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |

(56) References Cited

U.S. PATENT DOCUMENTS

| | | |
|---|---|---|
| 2006/0055384 A1 | 3/2006 | Jordan et al. |
| 2006/0066349 A1 | 3/2006 | Murakami |
| 2006/0068239 A1 | 3/2006 | Norimatsu et al. |
| 2006/0077046 A1 | 4/2006 | Endo |
| 2006/0085167 A1 | 4/2006 | Warfield et al. |
| 2006/0091958 A1 | 5/2006 | Bhatti et al. |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0116968 A1 | 6/2006 | Arisawa |
| 2006/0118162 A1 | 6/2006 | Saelzer et al. |
| 2006/0125449 A1 | 6/2006 | Unger |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0167762 A1 | 7/2006 | Hahn-Carlson |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222912 A1 | 10/2006 | Smith |
| 2006/0222916 A1 | 10/2006 | Norimatsu et al. |
| 2006/0225781 A1 | 10/2006 | Locher |
| 2006/0227577 A1 | 10/2006 | Horiuchi et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0238750 A1 | 10/2006 | Shimotomai |
| 2006/0243318 A1 | 11/2006 | Feldmeier et al. |
| 2006/0261751 A1 | 11/2006 | Okabe et al. |
| 2006/0266408 A1 | 11/2006 | Horne et al. |
| 2006/0267515 A1 | 11/2006 | Burke et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029468 A1 | 2/2007 | Sinton et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0103108 A1 | 5/2007 | Capp et al. |
| 2007/0103297 A1 | 5/2007 | Armstrong et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0217178 A1 | 9/2007 | Johnson et al. |
| 2007/0223165 A1 | 9/2007 | Itri et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0241720 A1 | 10/2007 | Sakamoto et al. |
| 2007/0246546 A1 | 10/2007 | Yoshida |
| 2007/0247135 A1 | 10/2007 | Koga |
| 2007/0247877 A1 | 10/2007 | Kwon et al. |
| 2007/0262802 A1 | 11/2007 | Huard et al. |
| 2007/0271006 A1 | 11/2007 | Golden et al. |
| 2007/0273240 A1 | 11/2007 | Steele et al. |
| 2007/0273339 A1 | 11/2007 | Haines |
| 2007/0273342 A1 | 11/2007 | Kataoka et al. |
| 2007/0273351 A1 | 11/2007 | Matan |
| 2007/0284451 A1 | 12/2007 | Uramoto |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0023061 A1 | 1/2008 | Clemens et al. |
| 2008/0024098 A1 | 1/2008 | Hojo |
| 2008/0030198 A1 | 2/2008 | Kawata et al. |
| 2008/0036440 A1 | 2/2008 | Garmer |
| 2008/0042709 A1 | 2/2008 | Chen et al. |
| 2008/0055941 A1 | 3/2008 | Victor et al. |
| 2008/0072091 A1 | 3/2008 | Hanson et al. |
| 2008/0080177 A1 | 4/2008 | Chang |
| 2008/0088184 A1 | 4/2008 | Tung et al. |
| 2008/0088829 A1 | 4/2008 | Fuyuki |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0156551 A1 | 7/2008 | Kawahara et al. |
| 2008/0164766 A1 | 7/2008 | Adest et al. |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0192510 A1 | 8/2008 | Falk |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266913 A1 | 10/2008 | Brotto et al. |
| 2008/0266919 A1 | 10/2008 | Mallwitz |
| 2008/0283118 A1 | 11/2008 | Rotzoll et al. |
| 2008/0291707 A1 | 11/2008 | Fang |
| 2008/0294472 A1 | 11/2008 | Yamada |
| 2008/0297963 A1 | 12/2008 | Lee et al. |
| 2008/0298608 A1 | 12/2008 | Wilcox |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |

(56)  References Cited

U.S. PATENT DOCUMENTS

| | | |
|---|---|---|
| 2009/0010035 A1 | 1/2009 | Williams |
| 2009/0012917 A1 | 1/2009 | Thompson et al. |
| 2009/0014050 A1 | 1/2009 | Haaf |
| 2009/0014057 A1 | 1/2009 | Croft et al. |
| 2009/0014058 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0029468 A1 | 1/2009 | Barbas et al. |
| 2009/0039833 A1 | 2/2009 | Kitagawa |
| 2009/0039852 A1 | 2/2009 | Fishelov et al. |
| 2009/0064252 A1 | 3/2009 | Howarter et al. |
| 2009/0066357 A1 | 3/2009 | Fornage |
| 2009/0066382 A1 | 3/2009 | Yousefzadeh et al. |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0078300 A1 | 3/2009 | Ang et al. |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0097283 A1 | 4/2009 | Krein et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0127448 A1 | 5/2009 | Fuyuki |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0160258 A1 | 6/2009 | Allen et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0183763 A1 | 7/2009 | Meyer |
| 2009/0184746 A1 | 7/2009 | Fahrenbruch |
| 2009/0189456 A1 | 7/2009 | Skutt |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1 | 8/2009 | Boniface et al. |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0238444 A1 | 9/2009 | Su et al. |
| 2009/0242011 A1 | 10/2009 | Proisy et al. |
| 2009/0243385 A1 | 10/2009 | Ichikawa |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284078 A1 | 11/2009 | Zhang et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2009/0295225 A1 | 12/2009 | Asplund et al. |
| 2009/0296434 A1 | 12/2009 | De Rooij et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0020576 A1 | 1/2010 | Falk |
| 2010/0026097 A1 | 2/2010 | Avrutsky et al. |
| 2010/0026736 A1 | 2/2010 | Plut |
| 2010/0038907 A1 | 2/2010 | Hunt et al. |
| 2010/0043781 A1 | 2/2010 | Jones et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0071742 A1 | 3/2010 | de Rooij et al. |
| 2010/0085670 A1 | 4/2010 | Palaniswami et al. |
| 2010/0103579 A1 | 4/2010 | Carkner et al. |
| 2010/0115093 A1 | 5/2010 | Rice |
| 2010/0124027 A1 | 5/2010 | Handelsman et al. |
| 2010/0124087 A1 | 5/2010 | Falk |
| 2010/0126550 A1 | 5/2010 | Foss |
| 2010/0127570 A1 | 5/2010 | Hadar et al. |
| 2010/0127571 A1 | 5/2010 | Hadar et al. |
| 2010/0131108 A1 | 5/2010 | Meyer |
| 2010/0132757 A1 | 6/2010 | He et al. |
| 2010/0132758 A1 | 6/2010 | Gilmore |
| 2010/0132761 A1 | 6/2010 | Echizenya et al. |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0141041 A1 | 6/2010 | Bose et al. |
| 2010/0141153 A1 | 6/2010 | Recker et al. |
| 2010/0147362 A1 | 6/2010 | King et al. |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0195357 A1 | 8/2010 | Fornage et al. |
| 2010/0195361 A1 | 8/2010 | Stem |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0213897 A1 | 8/2010 | Tse |
| 2010/0214808 A1 | 8/2010 | Rodriguez |
| 2010/0217551 A1 | 8/2010 | Goff et al. |
| 2010/0229915 A1 | 9/2010 | Ledenev et al. |
| 2010/0241375 A1 | 9/2010 | Kumar et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0289337 A1 | 11/2010 | Stauth et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301677 A1 | 12/2010 | Tomita |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0315043 A1 | 12/2010 | Chau |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0019444 A1 | 1/2011 | Dargatz et al. |
| 2011/0025130 A1 | 2/2011 | Hadar et al. |
| 2011/0026282 A1 | 2/2011 | Chapman et al. |
| 2011/0027626 A1 | 2/2011 | Lattin |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0045802 A1 | 2/2011 | Bland et al. |
| 2011/0049990 A1 | 3/2011 | Amaratunga et al. |
| 2011/0050002 A1 | 3/2011 | De Luca |
| 2011/0050190 A1 | 3/2011 | Avrutsky |
| 2011/0056533 A1 | 3/2011 | Kuan |
| 2011/0061705 A1 | 3/2011 | Croft et al. |
| 2011/0061713 A1 | 3/2011 | Powell et al. |

(56) References Cited

U.S. PATENT DOCUMENTS

| | | |
|---|---|---|
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0083733 A1 | 4/2011 | Marroquin et al. |
| 2011/0084553 A1 | 4/2011 | Adest et al. |
| 2011/0088741 A1 | 4/2011 | Dunton et al. |
| 2011/0101949 A1 | 5/2011 | Lopata et al. |
| 2011/0108087 A1 | 5/2011 | Croft et al. |
| 2011/0109158 A1 | 5/2011 | Olsen |
| 2011/0114154 A1 | 5/2011 | Lichy et al. |
| 2011/0115295 A1 | 5/2011 | Moon et al. |
| 2011/0115393 A1 | 5/2011 | He |
| 2011/0116294 A1 | 5/2011 | Wolf |
| 2011/0121441 A1 | 5/2011 | Halstead et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0133556 A1 | 6/2011 | Choi |
| 2011/0139213 A1 | 6/2011 | Lee |
| 2011/0140535 A1 | 6/2011 | Choi et al. |
| 2011/0140536 A1 | 6/2011 | Adest et al. |
| 2011/0141644 A1 | 6/2011 | Hastings et al. |
| 2011/0144822 A1 | 6/2011 | Choi |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0179726 A1 | 7/2011 | Pao et al. |
| 2011/0181251 A1 | 7/2011 | Porter et al. |
| 2011/0181340 A1 | 7/2011 | Gazit |
| 2011/0183537 A1 | 7/2011 | Fornage et al. |
| 2011/0198935 A1 | 8/2011 | Hinman et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0240100 A1 | 10/2011 | Lu et al. |
| 2011/0245989 A1 | 10/2011 | Makhota et al. |
| 2011/0246338 A1 | 10/2011 | Eich |
| 2011/0254372 A1 | 10/2011 | Haines et al. |
| 2011/0260866 A1 | 10/2011 | Avrutsky et al. |
| 2011/0267721 A1 | 11/2011 | Chaintreuil et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273017 A1 | 11/2011 | Borup et al. |
| 2011/0273024 A1 | 11/2011 | Butzmann |
| 2011/0273302 A1 | 11/2011 | Fornage et al. |
| 2011/0278955 A1 | 11/2011 | Signorelli et al. |
| 2011/0285205 A1 | 11/2011 | Ledenev et al. |
| 2011/0285375 A1 | 11/2011 | Deboy |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007434 A1 | 1/2012 | Perreault et al. |
| 2012/0007558 A1 | 1/2012 | Pigott |
| 2012/0007613 A1 | 1/2012 | Gazit |
| 2012/0019966 A1 | 1/2012 | DeBoer |
| 2012/0026763 A1 | 2/2012 | Humphrey et al. |
| 2012/0026769 A1 | 2/2012 | Schroeder et al. |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0042588 A1 | 2/2012 | Erickson, Jr. |
| 2012/0043818 A1 | 2/2012 | Stratakos et al. |
| 2012/0043823 A1 | 2/2012 | Stratakos et al. |
| 2012/0044014 A1 | 2/2012 | Stratakos et al. |
| 2012/0044717 A1 | 2/2012 | Suntio et al. |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0049819 A1 | 3/2012 | Mao et al. |
| 2012/0056483 A1 | 3/2012 | Capp et al. |
| 2012/0056591 A1 | 3/2012 | Abe et al. |
| 2012/0063177 A1 | 3/2012 | Garrity |
| 2012/0080943 A1 | 4/2012 | Phadke |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0104861 A1 | 5/2012 | Kojori et al. |
| 2012/0104863 A1 | 5/2012 | Yuan |
| 2012/0113554 A1 | 5/2012 | Paoletti et al. |
| 2012/0119584 A1 | 5/2012 | Hadar et al. |
| 2012/0126624 A1 | 5/2012 | Hester et al. |
| 2012/0127764 A1 | 5/2012 | Phadke et al. |
| 2012/0133372 A1 | 5/2012 | Tsai et al. |
| 2012/0134058 A1 | 5/2012 | Pamer et al. |
| 2012/0138123 A1 | 6/2012 | Newdoll et al. |
| 2012/0139343 A1 | 6/2012 | Adest et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0169291 A1 | 7/2012 | Abe et al. |
| 2012/0174961 A1 | 7/2012 | Larson et al. |
| 2012/0175961 A1 | 7/2012 | Har-Shai et al. |
| 2012/0175963 A1 | 7/2012 | Adest et al. |
| 2012/0187769 A1 | 7/2012 | Spannhake et al. |
| 2012/0194003 A1 | 8/2012 | Schmidt et al. |
| 2012/0199172 A1 | 8/2012 | Avrutsky |
| 2012/0200311 A1 | 8/2012 | Chaintreuil |
| 2012/0212066 A1 | 8/2012 | Adest et al. |
| 2012/0215367 A1 | 8/2012 | Eizips et al. |
| 2012/0217797 A1 | 8/2012 | Butzmann |
| 2012/0217973 A1 | 8/2012 | Avrutsky |
| 2012/0228931 A1 | 9/2012 | Butzmann |
| 2012/0240490 A1 | 9/2012 | Gangemi |
| 2012/0242156 A1 | 9/2012 | Butzmann et al. |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0268969 A1 | 10/2012 | Cuk |
| 2012/0271576 A1 | 10/2012 | Kamel et al. |
| 2012/0274145 A1 | 11/2012 | Taddeo |
| 2012/0274264 A1 | 11/2012 | Mun et al. |
| 2012/0280571 A1 | 11/2012 | Hargis |
| 2012/0299380 A1 | 11/2012 | Haupt |
| 2012/0318320 A1 | 12/2012 | Robbins |
| 2013/0002335 A1 | 1/2013 | DeGraaff |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0038124 A1 | 2/2013 | Newdoll et al. |
| 2013/0039028 A1 | 2/2013 | Korman et al. |
| 2013/0049710 A1 | 2/2013 | Kraft et al. |
| 2013/0057223 A1 | 3/2013 | Lee |
| 2013/0062956 A1 | 3/2013 | Meyer et al. |
| 2013/0062958 A1 | 3/2013 | Erickson, Jr. et al. |
| 2013/0063119 A1 | 3/2013 | Lubomirsky |
| 2013/0069438 A1 | 3/2013 | Liu et al. |
| 2013/0082724 A1 | 4/2013 | Noda et al. |
| 2013/0094112 A1 | 4/2013 | Burghardt et al. |
| 2013/0094262 A1 | 4/2013 | Avrutsky |
| 2013/0134790 A1 | 5/2013 | Amaratunga et al. |
| 2013/0175971 A1 | 7/2013 | Har-Shai et al. |
| 2013/0181533 A1 | 7/2013 | Capp et al. |
| 2013/0192657 A1 | 8/2013 | Hadar et al. |

(56)                References Cited

U.S. PATENT DOCUMENTS

| 2013/0193765 A1 | 8/2013 | Yoscovich |
| 2013/0194706 A1 | 8/2013 | Har-Shai et al. |
| 2013/0200709 A1 | 8/2013 | Kirchner et al. |
| 2013/0200710 A1 | 8/2013 | Robbins |
| 2013/0214607 A1 | 8/2013 | Harrison |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0269181 A1 | 10/2013 | McBride et al. |
| 2013/0271096 A1 | 10/2013 | Inagaki |
| 2013/0279210 A1 | 10/2013 | Chisenga et al. |
| 2013/0285459 A1 | 10/2013 | Jaoui et al. |
| 2013/0294126 A1 | 11/2013 | Garrity et al. |
| 2013/0307556 A1 | 11/2013 | Ledenev et al. |
| 2013/0313909 A1 | 11/2013 | Storbeck et al. |
| 2013/0320778 A1 | 12/2013 | Hopf et al. |
| 2013/0321013 A1 | 12/2013 | Pisklak et al. |
| 2013/0328541 A1 | 12/2013 | Euler et al. |
| 2013/0332093 A1 | 12/2013 | Adest et al. |
| 2013/0335861 A1 | 12/2013 | Laschinski et al. |
| 2014/0062206 A1 | 3/2014 | Bryson |
| 2014/0062209 A1 | 3/2014 | Liu et al. |
| 2014/0062396 A1 | 3/2014 | Reddy |
| 2014/0077756 A1 | 3/2014 | Kataoka et al. |
| 2014/0097808 A1 | 4/2014 | Clark et al. |
| 2014/0119072 A1 | 5/2014 | Behrends et al. |
| 2014/0119076 A1 | 5/2014 | Chang et al. |
| 2014/0167715 A1 | 6/2014 | Wu et al. |
| 2014/0169053 A1 | 6/2014 | Ilic et al. |
| 2014/0191583 A1 | 7/2014 | Chisenga et al. |
| 2014/0210485 A1 | 7/2014 | Lang et al. |
| 2014/0233136 A1 | 8/2014 | Heerdt |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265551 A1 | 9/2014 | Willis |
| 2014/0265579 A1 | 9/2014 | Mumtaz |
| 2014/0265629 A1 | 9/2014 | Gazit et al. |
| 2014/0265638 A1 | 9/2014 | Orr et al. |
| 2014/0268913 A1 | 9/2014 | Zheng et al. |
| 2014/0277796 A1 | 9/2014 | Peskin et al. |
| 2014/0293491 A1 | 10/2014 | Robbins |
| 2014/0306543 A1 | 10/2014 | Garrity et al. |
| 2014/0327313 A1 | 11/2014 | Arditi et al. |
| 2014/0327995 A1 | 11/2014 | Panjwani et al. |
| 2014/0354245 A1 | 12/2014 | Batikoff et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |
| 2015/0061409 A1 | 3/2015 | Dunton et al. |
| 2015/0069844 A1 | 3/2015 | Wu et al. |
| 2015/0100265 A1 | 4/2015 | Duchemin |
| 2015/0103572 A1 | 4/2015 | Jean |
| 2015/0131187 A1 | 5/2015 | Krein et al. |
| 2015/0161872 A1 | 6/2015 | Beaulieu et al. |
| 2015/0171789 A1 | 6/2015 | Har-Shai et al. |
| 2015/0183328 A1 | 7/2015 | Kusch et al. |
| 2015/0188415 A1 | 7/2015 | Abido et al. |
| 2015/0214889 A1 | 7/2015 | Nam et al. |
| 2015/0236589 A1 | 8/2015 | Baba |
| 2015/0263609 A1 | 9/2015 | Weida et al. |
| 2015/0318410 A1 | 11/2015 | Higuma |
| 2015/0351264 A1 | 12/2015 | Linderman |
| 2015/0364918 A1 | 12/2015 | Singh et al. |
| 2015/0372490 A1 | 12/2015 | Bakas et al. |
| 2015/0381108 A1 | 12/2015 | Hoft et al. |
| 2015/0381111 A1 | 12/2015 | Nicolescu et al. |
| 2016/0006392 A1 | 1/2016 | Hoft |
| 2016/0036235 A1 | 2/2016 | Getsla |
| 2016/0126367 A1 | 5/2016 | Dunton et al. |
| 2016/0172900 A1 | 6/2016 | Welch, Jr. |
| 2016/0181802 A1 | 6/2016 | Jacobson et al. |
| 2016/0190931 A1 | 6/2016 | Zhang |
| 2016/0211841 A1 | 7/2016 | Harrison |
| 2016/0226252 A1 | 8/2016 | Kravtiz et al. |
| 2016/0226257 A1 | 8/2016 | Porter et al. |
| 2016/0241039 A1 | 8/2016 | Cheng et al. |
| 2016/0268809 A1 | 9/2016 | Ledenev et al. |
| 2016/0270245 A1 | 9/2016 | Linderman |
| 2016/0276820 A1 | 9/2016 | Olivas et al. |
| 2016/0293115 A1 | 10/2016 | Yamashita et al. |
| 2016/0329715 A1 | 11/2016 | Orr et al. |
| 2016/0336899 A1 | 11/2016 | Ledenev et al. |
| 2016/0380436 A1 | 12/2016 | Porter et al. |
| 2017/0104413 A1 | 4/2017 | Busch et al. |
| 2017/0138804 A1 | 5/2017 | Lebental et al. |
| 2017/0179876 A1 | 6/2017 | Freeman et al. |
| 2017/0179886 A1 | 6/2017 | Oishi et al. |
| 2017/0184343 A1 | 6/2017 | Freer et al. |
| 2017/0207746 A1 | 7/2017 | Yoscovich et al. |
| 2017/0211190 A1 | 7/2017 | Glasscock et al. |
| 2017/0222542 A1 | 8/2017 | Adest et al. |
| 2017/0271879 A1 | 9/2017 | Ledenev et al. |
| 2017/0278375 A1 | 9/2017 | Galin et al. |
| 2017/0288384 A1 | 10/2017 | Loewenstern et al. |
| 2017/0331325 A1 | 11/2017 | Ristau |
| 2018/0034411 A1 | 2/2018 | Charles et al. |
| 2018/0145593 A1 | 5/2018 | Xi et al. |
| 2018/0191292 A1 | 7/2018 | Ehlmann |
| 2018/0248513 A1 | 8/2018 | Höft |
| 2018/0351401 A1 | 12/2018 | Binder et al. |
| 2019/0379279 A1 | 12/2019 | Adest et al. |
| 2019/0393834 A1 | 12/2019 | Har-Shai et al. |
| 2020/0176937 A1 | 6/2020 | Azad |
| 2020/0279963 A1 | 9/2020 | Yoscovich et al. |
| 2020/0373841 A1 | 11/2020 | Xie et al. |
| 2021/0036557 A1 | 2/2021 | Haug et al. |

FOREIGN PATENT DOCUMENTS

| AU | 2009202125 A1 | 12/2009 |
| AU | 2012225199 A1 | 10/2013 |
| CA | 1183574 A | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CA | 2702392 C | 9/2015 |
| CN | 2071396 U | 2/1991 |
| CN | 1106523 A | 8/1995 |
| CN | 2284479 Y | 6/1998 |
| CN | 1188453 A | 7/1998 |
| CN | 2305016 Y | 1/1999 |
| CN | 1236213 A | 11/1999 |
| CN | 1244745 A | 2/2000 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 2579063 Y | 10/2003 |
| CN | 1474492 A | 2/2004 |
| CN | 1523726 A | 8/2004 |
| CN | 1551377 A | 12/2004 |
| CN | 1185782 C | 1/2005 |
| CN | 2672668 Y | 1/2005 |
| CN | 2672938 Y | 1/2005 |
| CN | 1588773 A | 3/2005 |
| CN | 1201157 C | 5/2005 |
| CN | 1614854 A | 5/2005 |
| CN | 2706955 Y | 6/2005 |
| CN | 1245795 C | 3/2006 |
| CN | 1787717 A | 6/2006 |
| CN | 1794537 A | 6/2006 |
| CN | 1838191 A | 9/2006 |
| CN | 1841254 A | 10/2006 |
| CN | 1841823 A | 10/2006 |

(56) References Cited

FOREIGN PATENT DOCUMENTS

| | | | |
|---|---|---|---|
| CN | 1848588 | A | 10/2006 |
| CN | 1892239 | A | 1/2007 |
| CN | 1902809 | A | 1/2007 |
| CN | 1929276 | A | 3/2007 |
| CN | 1930925 | A | 3/2007 |
| CN | 1933315 | A | 3/2007 |
| CN | 2891438 | Y | 4/2007 |
| CN | 101030752 | A | 9/2007 |
| CN | 101050770 | A | 10/2007 |
| CN | 101107712 | A | 1/2008 |
| CN | 100371843 | C | 2/2008 |
| CN | 101128974 | A | 2/2008 |
| CN | 101136129 | A | 3/2008 |
| CN | 101180781 | A | 5/2008 |
| CN | 101257221 | A | 9/2008 |
| CN | 100426175 | C | 10/2008 |
| CN | 201167381 | Y | 12/2008 |
| CN | 201203438 | Y | 3/2009 |
| CN | 100487970 | C | 5/2009 |
| CN | 101488271 | A | 7/2009 |
| CN | 101521459 | A | 9/2009 |
| CN | 101523230 | A | 9/2009 |
| CN | 101647172 | A | 2/2010 |
| CN | 101672252 | A | 3/2010 |
| CN | 101697462 | A | 4/2010 |
| CN | 101779291 | A | 7/2010 |
| CN | 101847939 | A | 9/2010 |
| CN | 201601477 | U | 10/2010 |
| CN | 201623478 | U | 11/2010 |
| CN | 201623651 | U | 11/2010 |
| CN | 101902051 | A | 12/2010 |
| CN | 101902171 | A | 12/2010 |
| CN | 101904015 | A | 12/2010 |
| CN | 201663167 | U | 12/2010 |
| CN | 101939660 | A | 1/2011 |
| CN | 101951011 | A | 1/2011 |
| CN | 101951190 | A | 1/2011 |
| CN | 101953051 | A | 1/2011 |
| CN | 101953060 | A | 1/2011 |
| CN | 101976855 | A | 2/2011 |
| CN | 101976952 | A | 2/2011 |
| CN | 101980409 | A | 2/2011 |
| CN | 102084584 | A | 6/2011 |
| CN | 102089883 | A | 6/2011 |
| CN | 102117815 | A | 7/2011 |
| CN | 102148584 | A | 8/2011 |
| CN | 201926948 | U | 8/2011 |
| CN | 201956938 | U | 8/2011 |
| CN | 202034903 | U | 11/2011 |
| CN | 102273039 | A | 12/2011 |
| CN | 202103601 | U | 1/2012 |
| CN | 102362550 | A | 2/2012 |
| CN | 102386259 | A | 3/2012 |
| CN | 202178274 | U | 3/2012 |
| CN | 102474112 | A | 5/2012 |
| CN | 102565635 | A | 7/2012 |
| CN | 102771017 | A | 11/2012 |
| CN | 102845136 | A | 12/2012 |
| CN | 202871823 | U | 4/2013 |
| CN | 103227475 | A | 7/2013 |
| CN | 103280768 | A | 9/2013 |
| CN | 103299501 | A | 9/2013 |
| CN | 203367304 | U | 12/2013 |
| CN | 103548226 | A | 1/2014 |
| CN | 103580463 | A | 2/2014 |
| CN | 103875144 | A | 6/2014 |
| CN | 104143916 | A | 11/2014 |
| CN | 104158482 | A | 11/2014 |
| CN | 104253585 | A | 12/2014 |
| CN | 104488155 | A | 4/2015 |
| CN | 104685785 | A | 6/2015 |
| CN | 104779636 | A | 7/2015 |
| CN | 105075046 | A | 11/2015 |
| CN | 105164915 | A | 12/2015 |
| CN | 105490298 | A | 4/2016 |
| CN | 105553422 | A | 5/2016 |
| CN | 205609261 | U | 9/2016 |
| CN | 106093721 | A | 11/2016 |
| CN | 207304483 | U | 5/2018 |
| DE | 1161639 | B | 1/1964 |
| DE | 3236071 | A1 | 1/1984 |
| DE | 3525630 | A1 | 1/1987 |
| DE | 3729000 | A1 | 3/1989 |
| DE | 4019710 | A1 | 1/1992 |
| DE | 4032569 | A1 | 4/1992 |
| DE | 4041672 | A1 | 6/1992 |
| DE | 9312710 | U1 | 10/1993 |
| DE | 4232356 | A1 | 3/1994 |
| DE | 4325436 | A1 | 2/1995 |
| DE | 4328511 | A1 | 3/1995 |
| DE | 19515786 | A1 | 11/1995 |
| DE | 19502762 | A1 | 8/1996 |
| DE | 19614861 | A1 | 7/1997 |
| DE | 19609189 | A1 | 9/1997 |
| DE | 19618882 | A1 | 11/1997 |
| DE | 19701897 | A1 | 7/1998 |
| DE | 19718046 | A1 | 11/1998 |
| DE | 19732218 | C1 | 3/1999 |
| DE | 19737286 | A1 | 3/1999 |
| DE | 19838230 | A1 | 2/2000 |
| DE | 19846818 | A1 | 4/2000 |
| DE | 19859732 | A1 | 6/2000 |
| DE | 19904561 | C1 | 8/2000 |
| DE | 19928809 | A1 | 1/2001 |
| DE | 019937410 | A1 | 2/2001 |
| DE | 19961705 | A1 | 7/2001 |
| DE | 10064039 | A1 | 12/2001 |
| DE | 10060108 | A1 | 6/2002 |
| DE | 10103431 | A1 | 8/2002 |
| DE | 10136147 | A1 | 2/2003 |
| DE | 10219956 | A1 | 4/2003 |
| DE | 10222621 | A1 | 11/2003 |
| DE | 202004001246 | U1 | 4/2004 |
| DE | 10345302 | A1 | 4/2005 |
| DE | 102004043478 | A1 | 4/2005 |
| DE | 102004053942 | A1 | 5/2006 |
| DE | 102004037446 | A1 | 6/2006 |
| DE | 69734495 | T2 | 7/2006 |
| DE | 69735169 | T2 | 8/2006 |
| DE | 102005012213 | A1 | 8/2006 |
| DE | 102005018173 | A1 | 10/2006 |
| DE | 20 2005 020161 | U1 | 11/2006 |
| DE | 102005036153 | A1 | 12/2006 |
| DE | 102005030907 | A1 | 1/2007 |
| DE | 102005032864 | A1 | 1/2007 |
| DE | 102006023563 | A1 | 11/2007 |
| DE | 102006026073 | A1 | 12/2007 |
| DE | 202007002077 | U1 | 4/2008 |
| DE | 102006060815 | A1 | 6/2008 |
| DE | 602004011201 | T2 | 12/2008 |
| DE | 102007051134 | A1 | 3/2009 |
| DE | 202008012345 | U1 | 3/2009 |
| DE | 102007037130 | B3 | 4/2009 |
| DE | 102007050031 | B3 | 4/2009 |
| DE | 202009007318 | U1 | 8/2009 |
| DE | 102008042199 | A1 | 4/2010 |
| DE | 102008057874 | A1 | 5/2010 |
| DE | 102009051186 | A1 | 5/2010 |
| DE | 102009022569 | A1 | 12/2010 |
| DE | 102010023549 | A1 | 12/2011 |
| DE | 202011109688 | U1 | 3/2012 |
| DE | 102013101314 | A1 | 8/2014 |
| DE | 102013106255 | A1 | 12/2014 |
| DE | 102013106808 | A1 | 12/2014 |
| DE | 102016117229 | A1 | 3/2018 |
| EP | 0027405 | A1 | 4/1981 |
| EP | 169673 | A1 | 1/1986 |
| EP | 0178757 | A2 | 4/1986 |
| EP | 0206253 | A1 | 12/1986 |
| EP | 0231211 | A1 | 8/1987 |
| EP | 0293219 | A2 | 11/1988 |
| EP | 0340006 | A2 | 11/1989 |
| EP | 0418612 | A1 | 3/1991 |
| EP | 419093 | A2 | 3/1991 |

(56) References Cited

FOREIGN PATENT DOCUMENTS

| | | | |
|---|---|---|---|
| EP | 420295 | A1 | 4/1991 |
| EP | 0521467 | A2 | 1/1993 |
| EP | 0576271 | A2 | 12/1993 |
| EP | 0577334 | A2 | 1/1994 |
| EP | 604777 | A1 | 7/1994 |
| EP | 0628901 | A2 | 12/1994 |
| EP | 0642199 | A1 | 3/1995 |
| EP | 653692 | A2 | 5/1995 |
| EP | 0670915 | A1 | 9/1995 |
| EP | 677749 | A2 | 10/1995 |
| EP | 756178 | A2 | 1/1997 |
| EP | 0756372 | A1 | 1/1997 |
| EP | 0780750 | A2 | 6/1997 |
| EP | 0809293 | A1 | 11/1997 |
| EP | 824273 | A2 | 2/1998 |
| EP | 827254 | A2 | 3/1998 |
| EP | 0895146 | A1 | 2/1999 |
| EP | 0906660 | A1 | 4/1999 |
| EP | 0947904 | A2 | 10/1999 |
| EP | 0947905 | A2 | 10/1999 |
| EP | 964415 | A1 | 12/1999 |
| EP | 0978884 | A3 | 3/2000 |
| EP | 1012886 | A1 | 6/2000 |
| EP | 1024575 | A2 | 8/2000 |
| EP | 1034465 | A1 | 9/2000 |
| EP | 1035640 | A1 | 9/2000 |
| EP | 1039361 | A1 | 9/2000 |
| EP | 1039620 | A2 | 9/2000 |
| EP | 1039621 | A2 | 9/2000 |
| EP | 1047179 | A1 | 10/2000 |
| EP | 1130770 | A2 | 9/2001 |
| EP | 1143594 | A2 | 10/2001 |
| EP | 1187291 | A2 | 3/2002 |
| EP | 1235339 | A2 | 8/2002 |
| EP | 1239573 | A1 | 9/2002 |
| EP | 1239576 | A2 | 9/2002 |
| EP | 1254505 | A2 | 11/2002 |
| EP | 1271742 | A2 | 1/2003 |
| EP | 1291997 | A2 | 3/2003 |
| EP | 1330009 | A2 | 7/2003 |
| EP | 1339153 | A2 | 8/2003 |
| EP | 1369983 | A1 | 12/2003 |
| EP | 1376706 | A2 | 1/2004 |
| EP | 1388774 | A1 | 2/2004 |
| EP | 1400988 | A2 | 3/2004 |
| EP | 1407534 | A2 | 4/2004 |
| EP | 1120895 | A3 | 5/2004 |
| EP | 1418482 | A1 | 5/2004 |
| EP | 1429393 | A2 | 6/2004 |
| EP | 1442473 | A2 | 8/2004 |
| EP | 1447561 | A1 | 8/2004 |
| EP | 1457857 | A2 | 9/2004 |
| EP | 1463188 | A2 | 9/2004 |
| EP | 1475882 | A2 | 11/2004 |
| EP | 1503490 | A1 | 2/2005 |
| EP | 1521345 | A1 | 4/2005 |
| EP | 1526633 | A2 | 4/2005 |
| EP | 1531542 | A2 | 5/2005 |
| EP | 1531545 | A2 | 5/2005 |
| EP | 1532727 | A2 | 5/2005 |
| EP | 1552563 | A2 | 7/2005 |
| EP | 1562281 | A1 | 8/2005 |
| EP | 1580862 | A1 | 9/2005 |
| EP | 1603212 | A2 | 12/2005 |
| EP | 1610571 | A2 | 12/2005 |
| EP | 1623495 | A1 | 2/2006 |
| EP | 1642355 | A2 | 4/2006 |
| EP | 0964457 | A3 | 5/2006 |
| EP | 1657557 | A1 | 5/2006 |
| EP | 1657797 | A1 | 5/2006 |
| EP | 1684397 | A2 | 7/2006 |
| EP | 1691246 | A2 | 8/2006 |
| EP | 1706937 | A1 | 10/2006 |
| EP | 1708070 | A1 | 10/2006 |
| EP | 1716272 | A1 | 11/2006 |
| EP | 1728413 | A1 | 12/2006 |
| EP | 1734373 | A2 | 12/2006 |
| EP | 1750193 | A1 | 2/2007 |
| EP | 1766490 | A1 | 3/2007 |
| EP | 1782146 | A2 | 5/2007 |
| EP | 1785800 | A1 | 5/2007 |
| EP | 1837985 | A2 | 9/2007 |
| EP | 1842121 | A2 | 10/2007 |
| EP | 1609250 | B1 | 1/2008 |
| EP | 1887675 | A2 | 2/2008 |
| EP | 1901419 | A2 | 3/2008 |
| EP | 1902349 | A2 | 3/2008 |
| EP | 1911101 | A1 | 4/2008 |
| EP | 1914857 | A1 | 4/2008 |
| EP | 2048679 | A1 | 4/2009 |
| EP | 2054944 | A2 | 5/2009 |
| EP | 2061088 | A2 | 5/2009 |
| EP | 2092625 | A2 | 8/2009 |
| EP | 2092631 | A2 | 8/2009 |
| EP | 2130286 | A1 | 12/2009 |
| EP | 2135296 | A2 | 12/2009 |
| EP | 2135348 | A2 | 12/2009 |
| EP | 2144133 | A1 | 1/2010 |
| EP | 2179451 | A1 | 4/2010 |
| EP | 2206159 | A2 | 7/2010 |
| EP | 2232690 | A1 | 9/2010 |
| EP | 2234237 | A1 | 9/2010 |
| EP | 2249457 | A1 | 11/2010 |
| EP | 2256819 | A1 | 12/2010 |
| EP | 2315328 | A2 | 4/2011 |
| EP | 2355268 | A1 | 8/2011 |
| EP | 2374190 | A1 | 10/2011 |
| EP | 2386122 | A2 | 11/2011 |
| EP | 2393178 | A2 | 12/2011 |
| EP | 2395648 | A2 | 12/2011 |
| EP | 2495766 | A1 | 9/2012 |
| EP | 2515424 | A2 | 10/2012 |
| EP | 2533299 | A1 | 12/2012 |
| EP | 2549635 | A1 | 1/2013 |
| EP | 2561596 | A2 | 2/2013 |
| EP | 2581941 | A2 | 4/2013 |
| EP | 2615644 | A2 | 7/2013 |
| EP | 2621045 | A2 | 7/2013 |
| EP | 2666222 | A1 | 11/2013 |
| EP | 2722979 | A1 | 4/2014 |
| EP | 2779251 | A1 | 9/2014 |
| EP | 3176933 | A1 | 6/2017 |
| EP | 2139104 | B1 | 10/2017 |
| EP | 3252909 | A1 | 12/2017 |
| EP | 3382871 | A1 | 10/2018 |
| ES | 2249147 | A1 | 3/2006 |
| ES | 2249149 | A1 | 3/2006 |
| FR | 2796216 | A1 | 1/2001 |
| FR | 2819653 | A1 | 7/2002 |
| FR | 2894401 | A1 | 6/2007 |
| GB | 310362 | A | 9/1929 |
| GB | 612859 | A | 11/1948 |
| GB | 1211885 | A | 11/1970 |
| GB | 1231961 | A | 5/1971 |
| GB | 1261838 | A | 1/1972 |
| GB | 1571681 | A | 7/1980 |
| GB | 1597508 | A | 9/1981 |
| GB | 2128017 | A | 4/1984 |
| GB | 2327208 | A | 1/1999 |
| GB | 2339465 | A | 1/2000 |
| GB | 2376801 | A | 12/2002 |
| GB | 2399463 | A | 9/2004 |
| GB | 2399465 | A | 9/2004 |
| GB | 2415841 | A | 1/2006 |
| GB | 2419968 | A | 5/2006 |
| GB | 2421847 | A | 7/2006 |
| GB | 2434490 | A | 7/2007 |
| GB | 2476508 | A | 6/2011 |
| GB | 2480015 | B | 12/2011 |
| GB | 2482653 | A | 2/2012 |
| GB | 2483317 | A | 3/2012 |
| GB | 2485527 | A | 5/2012 |
| GB | 2486408 | A | 6/2012 |
| GB | 2487368 | A | 7/2012 |

(56) References Cited

FOREIGN PATENT DOCUMENTS

| | | | |
|---|---|---|---|
| GB | 2497275 | A | 6/2013 |
| GB | 2498365 | A | 7/2013 |
| GB | 2498790 | A | 7/2013 |
| GB | 2498791 | A | 7/2013 |
| GB | 2499991 | A | 9/2013 |
| JP | S56042365 | A | 4/1981 |
| JP | S60027964 | A | 2/1985 |
| JP | S60148172 | A | 8/1985 |
| JP | 61065320 | A | 4/1986 |
| JP | S62154121 | A | 7/1987 |
| JP | S62154122 | A | 7/1987 |
| JP | H01311874 | A | 12/1989 |
| JP | H04219982 | A | 8/1992 |
| JP | H04364378 | A | 12/1992 |
| JP | H05003678 | A | 1/1993 |
| JP | H06035555 | A | 2/1994 |
| JP | H06141261 | A | 5/1994 |
| JP | H07026849 | A | 1/1995 |
| JP | H07058843 | A | 3/1995 |
| JP | H07-222436 | A | 8/1995 |
| JP | H07322529 | A | 12/1995 |
| JP | 8009557 | A | 1/1996 |
| JP | H08033347 | A | 2/1996 |
| JP | H08066050 | A | 3/1996 |
| JP | H0897460 | A | 4/1996 |
| JP | 08138754 | A | 5/1996 |
| JP | H08116628 | A | 5/1996 |
| JP | H08181343 | A | 7/1996 |
| JP | H08185235 | A | 7/1996 |
| JP | H08204220 | A | 8/1996 |
| JP | H08227324 | A | 9/1996 |
| JP | H08316517 | A | 11/1996 |
| JP | H08317664 | A | 11/1996 |
| JP | 097644 | A | 1/1997 |
| JP | H094692 | A | 1/1997 |
| JP | H09097918 | A | 4/1997 |
| JP | H09148611 | A | 6/1997 |
| JP | H09148613 | A | 6/1997 |
| JP | H09275644 | A | 10/1997 |
| JP | 2676789 | B2 | 11/1997 |
| JP | H1017445 | A | 1/1998 |
| JP | H1075580 | A | 3/1998 |
| JP | H10201086 | A | 7/1998 |
| JP | H10201105 | A | 7/1998 |
| JP | H10308523 | A | 11/1998 |
| JP | 11041832 | A | 2/1999 |
| JP | H1146457 | A | 2/1999 |
| JP | 11103538 | A | 4/1999 |
| JP | 2892183 | B2 | 5/1999 |
| JP | 11206038 | A | 7/1999 |
| JP | H11266545 | A | 9/1999 |
| JP | 11289891 | A | 10/1999 |
| JP | 11318042 | A | 11/1999 |
| JP | H11332088 | A | 11/1999 |
| JP | 2000020150 | A | 1/2000 |
| JP | 2000051074 | A | 2/2000 |
| JP | 3015512 | B2 | 3/2000 |
| JP | 2000-112545 | A | 4/2000 |
| JP | 2000-116010 | A | 4/2000 |
| JP | 2000160789 | A | 6/2000 |
| JP | 2000166097 | A | 6/2000 |
| JP | 2000174307 | A | 6/2000 |
| JP | 2000232791 | A | 8/2000 |
| JP | 2000232793 | A | 8/2000 |
| JP | 2000316282 | A | 11/2000 |
| JP | 2000324852 | A | 11/2000 |
| JP | 2000339044 | A | 12/2000 |
| JP | 2000341974 | A | 12/2000 |
| JP | 2000347753 | A | 12/2000 |
| JP | 2000358330 | A | 12/2000 |
| JP | 200185716 | A | 3/2001 |
| JP | 2001060120 | A | 3/2001 |
| JP | 2001075662 | A | 3/2001 |
| JP | 2001086765 | A | 3/2001 |
| JP | 2001178145 | A | 6/2001 |
| JP | 2001189476 | A | 7/2001 |
| JP | 2001224142 | A | 8/2001 |
| JP | 2001238466 | A | 8/2001 |
| JP | 2001250964 | A | 9/2001 |
| JP | 2001255949 | A | 9/2001 |
| JP | 2001-320827 | A | 11/2001 |
| JP | 2002073184 | A | 3/2002 |
| JP | 2002231578 | A | 8/2002 |
| JP | 2002238246 | A | 8/2002 |
| JP | 2002-262461 | A | 9/2002 |
| JP | 2002270876 | A | 9/2002 |
| JP | 2002300735 | A | 10/2002 |
| JP | 2002339591 | A | 11/2002 |
| JP | 2002354677 | A | 12/2002 |
| JP | 2003068312 | A | 3/2003 |
| JP | 2003102134 | A | 4/2003 |
| JP | 2003124492 | A | 4/2003 |
| JP | 2003132959 | A | 5/2003 |
| JP | 2003132960 | A | 5/2003 |
| JP | 2003134661 | A | 5/2003 |
| JP | 2003134667 | A | 5/2003 |
| JP | 2003168487 | A | 6/2003 |
| JP | 2003282916 | A | 10/2003 |
| JP | 2003289674 | A | 10/2003 |
| JP | 3499941 | B2 | 2/2004 |
| JP | 2004047279 | A | 2/2004 |
| JP | 2004055603 | A | 2/2004 |
| JP | 2004-096090 | A | 3/2004 |
| JP | 2004111754 | A | 4/2004 |
| JP | 2004-147465 | A | 5/2004 |
| JP | 2004194500 | A | 7/2004 |
| JP | 2004260944 | A | 9/2004 |
| JP | 2004-334704 | A | 11/2004 |
| JP | 2004312994 | A | 11/2004 |
| JP | 2005-151662 | A | 6/2005 |
| JP | 3656531 | B2 | 6/2005 |
| JP | 2005192314 | A | 7/2005 |
| JP | 2005-235082 | A | 9/2005 |
| JP | 2005251039 | A | 9/2005 |
| JP | 2005-276942 | A | 10/2005 |
| JP | 2005283516 | A | 10/2005 |
| JP | 2005-312287 | A | 11/2005 |
| JP | 2006041440 | A | 2/2006 |
| JP | 2006262619 | A | 9/2006 |
| JP | 2006271083 | A | 10/2006 |
| JP | 2006278755 | A | 10/2006 |
| JP | 2007058845 | A | 3/2007 |
| JP | 2007104872 | A | 4/2007 |
| JP | 2007225625 | A | 9/2007 |
| JP | 4174227 | B2 | 10/2008 |
| JP | 2010-146047 | A | 7/2010 |
| JP | 2010245532 | A | 10/2010 |
| JP | 2011-055634 | A | 3/2011 |
| JP | 2011-249790 | A | 12/2011 |
| JP | 2012-60714 | A | 3/2012 |
| JP | 2012511299 | A | 5/2012 |
| JP | 2012178535 | A | 9/2012 |
| JP | 2015-233386 | A | 12/2015 |
| KR | 20010044490 | A | 6/2001 |
| KR | 20030050390 | A | 6/2003 |
| KR | 20040086088 | A | 10/2004 |
| KR | 100468127 | B1 | 1/2005 |
| KR | 200402282 | Y1 | 11/2005 |
| KR | 20060060825 | A | 6/2006 |
| KR | 20070036528 | A | 4/2007 |
| KR | 100725755 | B1 | 5/2007 |
| KR | 20080092747 | A | 10/2008 |
| KR | 100912892 | B1 | 8/2009 |
| KR | 101073143 | B1 | 10/2011 |
| NL | 1011483 | C2 | 9/2000 |
| TW | 497326 | B | 8/2002 |
| TW | 200913291 | A | 3/2009 |
| WO | 8202134 | A1 | 6/1982 |
| WO | 1984003402 | A1 | 8/1984 |
| WO | 1988004801 | A1 | 6/1988 |
| WO | 9003680 | A1 | 4/1990 |
| WO | 1992007418 | A1 | 4/1992 |
| WO | 1993013587 | A1 | 7/1993 |
| WO | 95/25374 | A1 | 9/1995 |

(56) References Cited

FOREIGN PATENT DOCUMENTS

| | | | |
|---|---|---|---|
| WO | 95/34121 | A1 | 12/1995 |
| WO | 1996007130 | A1 | 3/1996 |
| WO | 1996013093 | A1 | 5/1996 |
| WO | 1998023021 | A2 | 5/1998 |
| WO | 1999028801 | A1 | 6/1999 |
| WO | 00/00839 | A1 | 1/2000 |
| WO | 00/21178 | A1 | 4/2000 |
| WO | 0042689 | A1 | 7/2000 |
| WO | 0075947 | A1 | 12/2000 |
| WO | 0077522 | A1 | 12/2000 |
| WO | 01/13502 | A1 | 2/2001 |
| WO | 01047095 | A2 | 6/2001 |
| WO | 02/17469 | A1 | 2/2002 |
| WO | 0231517 | | 4/2002 |
| WO | 02056126 | A1 | 7/2002 |
| WO | 2002073785 | A1 | 9/2002 |
| WO | 02078164 | A1 | 10/2002 |
| WO | 02093655 | A1 | 11/2002 |
| WO | 03012569 | A1 | 2/2003 |
| WO | 03/026114 | A2 | 3/2003 |
| WO | 2003036688 | A2 | 5/2003 |
| WO | 2003050938 | A2 | 6/2003 |
| WO | 2003071655 | A1 | 8/2003 |
| WO | 03084041 | A1 | 10/2003 |
| WO | 2003098703 | | 11/2003 |
| WO | 2004001942 | A1 | 12/2003 |
| WO | 2004006342 | A1 | 1/2004 |
| WO | 2004008619 | A2 | 1/2004 |
| WO | 2004023278 | A2 | 3/2004 |
| WO | 2004053993 | A1 | 6/2004 |
| WO | 2004090993 | A2 | 10/2004 |
| WO | 2004098261 | A2 | 11/2004 |
| WO | 2004100344 | A2 | 11/2004 |
| WO | 2004100348 | A1 | 11/2004 |
| WO | 2004107543 | A2 | 12/2004 |
| WO | 2005015584 | A2 | 2/2005 |
| WO | 2005027300 | A1 | 3/2005 |
| WO | 2005036725 | A1 | 4/2005 |
| WO | 2005053189 | A1 | 6/2005 |
| WO | 2005069096 | A1 | 7/2005 |
| WO | 2005076444 | A1 | 8/2005 |
| WO | 2005076445 | A1 | 8/2005 |
| WO | 2005089030 | A1 | 9/2005 |
| WO | 2005112551 | A2 | 12/2005 |
| WO | 2005119278 | A1 | 12/2005 |
| WO | 2005119609 | A2 | 12/2005 |
| WO | 2005124498 | A1 | 12/2005 |
| WO | 2006002380 | A2 | 1/2006 |
| WO | 2006005125 | A1 | 1/2006 |
| WO | 2006007198 | A1 | 1/2006 |
| WO | 2006011071 | A2 | 2/2006 |
| WO | 2006011359 | A1 | 2/2006 |
| WO | 2006013600 | A2 | 2/2006 |
| WO | 2006033143 | A1 | 3/2006 |
| WO | 2006045016 | A2 | 4/2006 |
| WO | 2006048688 | A1 | 5/2006 |
| WO | 2006048689 | A2 | 5/2006 |
| WO | 2006/074561 | A1 | 7/2006 |
| WO | 2006071436 | A2 | 7/2006 |
| WO | 2006078685 | A2 | 7/2006 |
| WO | 2006079503 | A2 | 8/2006 |
| WO | 2006089778 | A2 | 8/2006 |
| WO | 2006110613 | A2 | 10/2006 |
| WO | 2006/125664 | A1 | 11/2006 |
| WO | 2006117551 | A2 | 11/2006 |
| WO | 2006130520 | A2 | 12/2006 |
| WO | 2006137948 | A2 | 12/2006 |
| WO | 2007006564 | A2 | 1/2007 |
| WO | 2007007360 | A2 | 1/2007 |
| WO | 2007010326 | A1 | 1/2007 |
| WO | 2007/020419 | A1 | 2/2007 |
| WO | 2007048421 | A2 | 5/2007 |
| WO | 2007072517 | A1 | 6/2007 |
| WO | 2007073951 | A1 | 7/2007 |
| WO | 2007080429 | A2 | 7/2007 |
| WO | 2007084196 | A2 | 7/2007 |
| WO | 2007090476 | A2 | 8/2007 |
| WO | 2006124130 | A9 | 10/2007 |
| WO | 2007113358 | A1 | 10/2007 |
| WO | 2007124518 | A1 | 11/2007 |
| WO | 2007129808 | A1 | 11/2007 |
| WO | 2007142693 | A2 | 12/2007 |
| WO | 2008008528 | A2 | 1/2008 |
| WO | 2008026207 | A2 | 3/2008 |
| WO | 2008/046370 | A1 | 4/2008 |
| WO | 2008/077473 | A2 | 7/2008 |
| WO | 2008069926 | A3 | 8/2008 |
| WO | 2008097591 | A2 | 8/2008 |
| WO | 2008119034 | A1 | 10/2008 |
| WO | 2008121266 | A2 | 10/2008 |
| WO | 2008125915 | A2 | 10/2008 |
| WO | 2008132551 | A2 | 11/2008 |
| WO | 2008132553 | A2 | 11/2008 |
| WO | 2008142480 | A2 | 11/2008 |
| WO | 2009003680 | A1 | 1/2009 |
| WO | 2009006879 | A2 | 1/2009 |
| WO | 2009007782 | A2 | 1/2009 |
| WO | 2009011780 | A2 | 1/2009 |
| WO | 2009020917 | A2 | 2/2009 |
| WO | 2009/026602 | A1 | 3/2009 |
| WO | 2009046533 | A1 | 4/2009 |
| WO | 2009051221 | A1 | 4/2009 |
| WO | 2009051222 | A1 | 4/2009 |
| WO | 2009051853 | A1 | 4/2009 |
| WO | 2009051854 | A1 | 4/2009 |
| WO | 2009051870 | A1 | 4/2009 |
| WO | 2009055474 | A1 | 4/2009 |
| WO | 2009/059877 | A1 | 5/2009 |
| WO | 2009056957 | A2 | 5/2009 |
| WO | 2009059028 | A2 | 5/2009 |
| WO | 2009064683 | A2 | 5/2009 |
| WO | 2009/072075 | A2 | 6/2009 |
| WO | 2009/073867 | A1 | 6/2009 |
| WO | 2009072076 | A2 | 6/2009 |
| WO | 2009072077 | A1 | 6/2009 |
| WO | 2009073868 | A1 | 6/2009 |
| WO | 2009073995 | A1 | 6/2009 |
| WO | 2009075985 | A2 | 6/2009 |
| WO | 2009098729 | A1 | 8/2009 |
| WO | 2009114341 | A2 | 9/2009 |
| WO | 2009118682 | A2 | 10/2009 |
| WO | 2009118683 | A2 | 10/2009 |
| WO | 2009136358 | A1 | 11/2009 |
| WO | 2009140539 | A2 | 11/2009 |
| WO | 2009140543 | A2 | 11/2009 |
| WO | 2009155392 | A1 | 12/2009 |
| WO | 2010/002960 | A1 | 1/2010 |
| WO | 2010/003941 | A2 | 1/2010 |
| WO | 2009/140536 | A3 | 2/2010 |
| WO | 2009/140551 | A3 | 2/2010 |
| WO | 2010014116 | A1 | 2/2010 |
| WO | 2010020385 | A2 | 2/2010 |
| WO | 2010/042124 | A1 | 4/2010 |
| WO | 2010037393 | A1 | 4/2010 |
| WO | 2010056777 | A1 | 5/2010 |
| WO | 2010/071855 | A2 | 6/2010 |
| WO | 2010062410 | A1 | 6/2010 |
| WO | 2010062662 | A2 | 6/2010 |
| WO | 2010065043 | A1 | 6/2010 |
| WO | 2010065388 | A1 | 6/2010 |
| WO | 2010072717 | A1 | 7/2010 |
| WO | 2010078303 | A2 | 7/2010 |
| WO | 2010080672 | A2 | 7/2010 |
| WO | 2010091025 | A2 | 8/2010 |
| WO | 2010094012 | A1 | 8/2010 |
| WO | 2010118503 | A1 | 10/2010 |
| WO | 2010120315 | A1 | 10/2010 |
| WO | 2010/132369 | A1 | 11/2010 |
| WO | 20100134057 | A1 | 11/2010 |
| WO | 2011005339 | A1 | 1/2011 |
| WO | 2011011711 | A2 | 1/2011 |
| WO | 2011014275 | A1 | 2/2011 |
| WO | 2011017721 | A1 | 2/2011 |
| WO | 2011019936 | A1 | 2/2011 |

(56) References Cited

FOREIGN PATENT DOCUMENTS

| | | | |
|---|---|---|---|
| WO | 2011023732 A2 | 3/2011 | |
| WO | 2011028456 A2 | 3/2011 | |
| WO | 2011028457 A2 | 3/2011 | |
| WO | 2011044641 A1 | 4/2011 | |
| WO | 2011049985 A1 | 4/2011 | |
| WO | 2011059067 A1 | 5/2011 | |
| WO | 2011074025 A1 | 6/2011 | |
| WO | 2011076707 A2 | 6/2011 | |
| WO | 2011085259 A2 | 7/2011 | |
| WO | 2011089607 A1 | 7/2011 | |
| WO | 2011109746 A2 | 9/2011 | |
| WO | 2011119587 A2 | 9/2011 | |
| WO | 2011133843 A2 | 10/2011 | |
| WO | 2011133928 A2 | 10/2011 | |
| WO | 2011151672 A1 | 12/2011 | |
| WO | 2012024538 A3 | 5/2012 | |
| WO | 2012100263 A2 | 7/2012 | |
| WO | 2013015921 A1 | 1/2013 | |
| WO | 2013019899 A2 | 2/2013 | |
| WO | 2013064828 A1 | 5/2013 | |
| WO | 2013130563 A1 | 9/2013 | |
| WO | 2014143021 A1 | 9/2014 | |
| WO | 2017/125375 A1 | 7/2017 | |
| WO | 2018122835 A1 | 7/2018 | |

OTHER PUBLICATIONS

Philips Semiconductors, Data Sheet PSMN005-55B; PSMN005-55P N-channel logic trenchMOS transistor, Oct. 1999, Product specification, pp. 1-11.

International Preliminary Report on Patentability Issued in corresponding international application No. PCT/US04/16668, filed May 27, 2004.

International Application No. PCT/US13/27965, International Preliminary Examination Report, Sep. 2, 2014.

International Patent Application PCT/US13/027965, International Search Report and Written Opinion, Jun. 2, 2013.

International Application No. PCT/US12/44045, International Preliminary Examination Report, Jan. 28, 2014.

International Patent Application No. PCT/US2012/044045, International Search Report and Written Opinion, Jan. 2, 2013.

International Patent Application No. PCT/US2009/047734, International Search Report and Written Opinion, May 4, 2010.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

International Patent Application No. PCT/US2010/029929, International Search Report and Written Opinion, Oct. 27, 2010.

Lowe, Electronics Basis: What is a Latch Circuit, http://www.dummies.com/how-to/content/electronics-basics-what-is-a-latch-circuit.html, from Electronics All-in-One for Dummies, Feb. 2012, downloaded Jul. 13, 2014.

International Patent Application No. PCT/US2011/020591, International Search Report and Written Opinion, Aug. 8, 2011.

International Patent Application No. PCT/US2011/033544, International Search Report and Written Opinion, Nov. 24, 2011.

J. Keller and B. Kroposki, titled, "Understanding Fault Characteristics of Inverter-Based Distributed Energy Resources", in a Technical Report NREL/TP-550-46698, published Jan. 2010, pp. 1 through 48.

International Patent Application No. PCT/US2008/081827, International Search Report and Written Opinion, Jun. 24, 2009.

International Patent Application No. PCT/US2010/046274 International Search Report and Written Opinion, Apr. 22, 2011.

International Patent Application No. PCT/US2011/033658, International Search Report and Written Opinion, Jan. 13, 2012.

International Patent Application No. PCT/US2011/029392, International Search Report and Written Opinion, Oct. 24, 2011.

European Patent Application No. 09829487.9, Extended Search Report, Apr. 21, 2011.

International Patent Application No. PCT/US2009/062536, International Search Report and Written Opinion, Jun. 17, 2010.

International Patent Application No. PCT/US2010/022915, International Search Report and Written Opinion, Aug. 23, 2010.

International Patent Application No. PCT/US2010/046272, International Search Report and Written Opinion, Mar. 31, 2011.

Exell et al., "The Design and Development of a Solar Powered Refrigerator", [retrieved on Feb. 13, 2013], Retrieved from the Internet <URL: http://www.appropedia.org/The_Design_and_Development_of_a_Solar_Powered_Refrigerator>, pp. 1-64.

"Development of Water-Lithium Bromide Low-Temperature Absorption Refridgerating Machine", 2002 Energy & Environment on Database on Noteworthy contributions for Science and Technology (Japan), Research Data (No. 1748) [online], [retrieved on Aug. 29, 2012]. Retrieved from the Internet: <URL: http://dbnstl.nii.ac.jp/english/detail/1748>, pp. 1-4.

Dictionary.com, "air conditioning" [online], [retrieved on Aug. 28, 2012]. Retrieved from the Internet: <URL: http://dictionary.reference.com/browse/air+conditioning?s=t>, pp. 1-3.

International Patent Application No. PCT/US2010/029936, International Search Report and Written Opinion, Nov. 12, 2010.

International Patent Application No. PCT/US08/75127, International Search Report and Written Opinion, Apr. 28, 2009.

International Patent Application No. PCT/US09/35890, International Search Report and Written Opinion, Oct. 1, 2009.

European Patent Application No. 08845104.2, Extended Search Report, Jul. 31, 2014.

European Patent Application No. 11772811.3, Extended Search Report, Dec. 15, 2014.

International Patent Application No. PCT/US2008/082935, International Search Report and Written Opinion, Jun. 25, 2009.

Bhatnagar et al., Silicon Carbide High Voltage (400 V) Shottky Barrier Diodes, IEEE Electron Device Letters, vol. 13 (10) p. 501-503 Oct. 10, 1992.

Jun. 6-10, 2004—Rodriguez, C., and G. A. J. Amaratunga. "Dynamic stability of grid-connected photovoltaic systems." Power Engineering Society General Meeting, 2004. IEEE, pp. 2194-2200.

Nov. 3-Dec. 29, 1999—Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.

Oct. 7-12, 1990—Nonaka, Sakutaro, et al. "Interconnection system with single phase IGBT PWM CSI between photovoltaic arrays and the utility line." Industry Applications Society Annual Meeting, 1990., Conference Record of the 1990 IEEE.

Jun. 23-27, 2002—Calais, Martina, et al. "Inverters for single-phase grid connected photovoltaic systems-an overview." Power Electronics Specialists Conference, 2002. pesc 02. 2002 IEEE 33rd Annual. vol. 4. IEEE, 2002.

Jul. 1999—Marra, Enes Goncalves, and José Antenor Pomilio. "Self-excited induction generator controlled by a VS-PWM bidirectional converter for rural applications." Industry Applications, IEEE Transactions on 35.4 (1999): 877-883.

Apr. 2-5, 2002—Xiaofeng Sun, Weiyang Wu, Xin Li, Qinglin Zhao: A Research on Photovoltaic Energy Controlling System with Maximum Power Point Tracking:; Proceedings of the Power Conversion Conference-Osaka 2002 (Cat. No. 02TH8579) IEEE-Piscataway, NJ, USA, ISBN 0-7803-7156-9, vol. 2, p. 822-826, XP010590259: the whole document.

International Search Report for corresponding PCT/GB2005/050198 completed Jun. 28, 2006 by C. Wirner of the EPO.

Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.

Cordonnier, Charles-Edouard, et al., "Application Considerations for Sensefet Power Devices," PCI Proceedings, May 11, 1987, pp. 47-65.

(56) References Cited

OTHER PUBLICATIONS

Jun. 9-11, 2003—Kotsopoulos, Andrew, et al., "Predictive DC Voltage Control of Single-Phase PV Inverters with Small DC Link Capacitance," IEEE International Symposium, Month Unknown, 2003, pp. 793-797.

Meinhardt, Mike, et al., "Multi-String-Converter with Reduced Specific Costs and Enhanced Functionality," Solar Energy, May 21, 2001, pp. 217-227, vol. 69, Elsevier Science Ltd.

Mar. 6-10, 2005—Kimball, et al.: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.

Martins, et al.: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.

International Search Report for corresponding PCT/GB2005/050197, completed Dec. 20, 2005 by K-R Zettler of the EPO.

Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.

Jun. 23-27, 2002—Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference 2002, pp. 1483-1488, vol. 3, IEEE.

Written Opinion of PCT/GB2005/050197, Feb. 14, 2006 (mailing date), Enecsys Limited.

Jun. 17-21, 2001—Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.

Dec. 31, 2020—CN Invalidation Decision—CN 200780045351.2.

Dec. 31, 2020—CN Invalidation Decision—CN 201210253614.1.

Mar. 3, 2021—EP Office Action—EP 17188365.5.

May 7, 2021—Chinese Office Action—CN 20181025083.8.

Jun. 21, 2021—Japanese Office Action—JP 2017-158887.

Zhao Junjian & al.: "Analysis of high efficiency DC/DC converter processing partial input/output power", 14th Workshop on Control and Modeling for Power Electronics, Jun. 23, 2013 (Jun. 23, 2013), DOI: 10.1109/COMPEL.2013.6626440.

Apr. 14, 2021—European Summons to Oral Proceedings—EP 17724234.4.

PV Balancers: Concept, Architecture, and Realization—Huimmin Zhou—IEEE Transactions on Power Electronics vol. 30 No. 7—Jul. 7, 2015.

Petition for Inter Partes Review of U.S. Pat. No. 10,256,770; IPR 2021-00540; Petitioner *Altenergy Power Systems Inc* vs. Patent Owner *Tigo Energy Inc.*

Declaration in Support of Petition for Inter Partes Review of U.S. Pat. No. 10,256,770; IPR 2021-00540; Petitioner *Altenergy Power Systems Inc* vs. Patent Owner *Tigo Energy Inc.*

Petition for Inter Partes Review of U.S. Pat. No. 8,988,321; IPR 2021-00541; Petitioner *Altenergy Power Systems Inc* vs. Patent Owner *Tigo Energy Inc.*

Declaration in Support of Petition for Inter Partes Review of U.S. Pat. No. 8,933,321; IPR 2021-00541; Petitioner *Altenergy Power Systems Inc* vs. Patent Owner *Tigo Energy Inc.*

Petition for Inter Partes Review of U.S. Pat. No. 8,933,321; IPR 2021-01286; Petitioner *SunSpec Alliance* vs. Patent Owner *Tigo Energy Inc.*

Declaration in Support of Petition for Inter Partes Review of U.S. Pat. No. 8,933,321; IPR 2021-01286; Petitioner *SunSpec Alliance* vs. Patent Owner *Tigo Energy Inc.*

Petition for Inter Partes Review of U.S. Pat. No. 10,256,770; IPR 2021-01287; Petitioner *SunSpec Alliance* vs. Patent Owner *Tigo Energy Inc.*

Declaration in Support of Petition for Inter Partes Review of U.S. Pat. No. 10,256,770; IPR 2021-01287; Petitioner *SunSpec Alliance* vs. Patent Owner *Tigo Energy Inc.*

Maxouris, et al. "United States sets record for most Covid-19 deaths reported in one day," Jan. 13, 2021, CNN, https://www.cnn.com/2021/01/12/health/us-coronavirus-tuesday/index.html.

Texas Instruments, CMOS Ripple-Carry Binary Counter/Dividers, acquired from Harris Semiconductor SCHS030D—Revised Dec. 2003.

Excerpts from IEEE 100—The Authoritative Dictionary of IEEE Standards Terms (7th Ed. 2000).

Excerpts from Paul Horowitz & Winfield Hill—The Art of Electronics (2d. Ed. 1989).

Webeck, Evan, "Coronavirus: California sets another daily case record in possible first sign of 'surge on top of a surge,'" Jan. 5, 2021, The Mercury News (California).

Declaration of Randy R. Dunton in Support of Petition for Inter Partes Review of U.S. Pat. No. 8,933,321, Petitioner *Altenergy Power Systems, Inc.* v. *Tigo Energy Inc.*, IPR2021-00541.

Declaration of Randy R. Dunton in Support of Petition for Inter Partes Review of U.S. Pat. No. 10,256,770, Petitioner *Altenergy Power Systems, Inc.* v. *Tigo Energy Inc.*, IPR2021-00540.

Declaration of Randy R. Dunton in Support of Petition for Inter Partes Review of U.S. Pat. No. 8,933,321, Petitioner *SunSpec Alliance* v. Patent Owner *Tigo Energy Inc.*, IPR2021-01286.

Declaration of Randy R. Dunton in Support of Petition for Inter Partes Review of U.S. Pat. No. 10,256,770, Petitioner *SunSpec Alliance* v. Patent Owner *Tigo Energy Inc.*, IPR2021-01287.

Nov. 17, 2021—CN Office Action—CN App No. 201810025083.8.

Dec. 16, 2021—EP Office Action—EP App. No. 19178054.3.

Noguchi, Short-Current Pulse-Based Maximum-Power-Point Tracking Method for Multiple Photovoltaic-and-Converter Module System, IECON, Feb. 2002.

Siri, Maximum Power Tracking in Parallel Connected Converters, IEEE, Jul. 1993.

Solero, Performance of A 10 KW Power Electronic Interface For Combined Wind/PV Isolated Generating Systems, PESC, 1996.

Wu, An Improved Dynamic Power Distribution Control Scheme for Pwm Controlled Converter Modules, IEEE, 1992.

Jun. 30, 2022—Extended EP Search Report—EP App. No. 22150308.9.

Jul. 7, 2023—European Search Report—EP App. No. 22191698.4.

Oct. 5, 2023—European Search Report—EP App. No. 23180721.5.

Dec. 12, 2023—Japanese Office Action—JP App. No. 2020-004452.

Jan. 18, 2023—Chinese Notice of Allowance—CN App. No. 202010044554.7.

Jan. 30, 2024—CN Office Action—CN 202110858752.1.

Summons to Oral Proceedings Pursuant to Rule 115(1) EPC, dated Feb. 26, 2024 regarding EP Patent No. 2557650.

"Parallel connection and shunt of resistors", Fundamentals of Circuit, Wang Lianqi, Xidian university Publishing House, pp. 19-21.

Jun. 1, 2024—Chinese Office Action—CN App. No. 202110496807.9.

Subudhi et al., "A Comparative Study on Maximum Power Point Tracking Techniques for Photovoltaic Power Systems," IEEE Transactions on Sustainable Energy, vol. 4, No. 1, Jan. 2013.

International Search Report for corresponding PCT/GB2004/001965, completed Aug. 16, 2004 by A. Roider.

Mar. 5-9, 1995—Naik et al., A Novel Grid Interface for Photovoltaic, Wind-Electric, and Fuel-Cell Systems With a Controllable Power Factor or Operation, IEEE, 1995, pp. 995-998.

Petkanchin, Processes following changes of phase angle between current and voltage in electric circuits, Aug. 1999, Power Engineering Review, IEEE vol. 19, Issue 8, pp. 59-60.

Mumtaz, Asim, et al., "Grid Connected PV Inverter Using a Commercially Available Power IC," PV in Europe Conference, Oct. 2002, 3 pages, Rome, Italy.

Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.

(56) References Cited

OTHER PUBLICATIONS

European Search Report—EP App. 14159457.2—mailed Jun. 12, 2015.
European Search Report and Written Opinion—EP Appl. 12150819. 6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Chinese Office Action—CN Appl. 201280006369.2—dated Aug. 4, 2015.
Chinese Office Action—CN Appl. 201210253614.1—dated Aug. 18, 2015.
Extended European Search Report, EP Application 04753488.8, mailed Apr. 29, 2015.
International Search Report from PCT/US04/16668, form PCT/ISA/ 220, filing date May 27, 2004.
Office Action U.S. Appl. No. 13/785,857, dated Jun. 6, 2013.
Partial Extended European Search Report, EP Application 04753488. 8, mailed Feb. 2, 2015.
The International Search Report (Form PCT /ISA/220) Issued in corresponding international application No. PCT/US04/16668, filed May 27, 2004.
International Search Report—PCT/US2004/016668, form PCT/ISA/ 220—filing date May 27, 2004—mailed Jan. 19, 2005.
Written Opinion of the International Searching Authority—PCT/ US2004/016668, form PCT/ISA/220—filing date May 27, 2004— mailed Jan. 19, 2005.
Extended European Search Report—EP Appl. 04753488.8—mailed Apr. 29, 2015.
Supplementary Partial European Search Report—EP Appl. 04753488. 8—mailed Feb. 2, 2015.
US Office Action—U.S. Appl. No. 13/785,857—mailed Jun. 6, 2013.
European Office Action—EP Appl. 09725443.7—dated Aug. 18, 2015.
Definition of Isomorphism by Merriam-Webster, <http://www. merriaum-webster.com/dictionary/isomorphism, dated Oct. 20, 2015.
Definition of Isomorphic by Merriam-Webster, <http://www.merriam-webster.com/dictionary/isomorphic, dated Oct. 20, 2015.
Chinese Office Action—CN Appl. 201110349734.7—dated Oct. 13, 2015.
Chinese Office Action—CN Appl. 201210007491.3—dated Nov. 23, 2015.
European Office Action—EP Appl. 12176089.6—dated Dec. 16, 2015.
Chinese Office Action—CN Appl. 201310035223.7—dated Dec. 29, 2015.
Chinese Office Action—CN Application 201210334311.2—dated Jan. 20, 2016.
European Search Report—EP Appl. 13800859.4—mailed Feb. 15, 2016.
Chinese Office Action—CN App. 201310035221.8—mailed Mar. 1, 2016.
PCT/2008/058473 International Preliminary Report, 6 pages, Nov. 2, 2009.
International Search Report and Written Opinion, WO 2010080672, dated Aug. 19, 2010.
PCT/US2010/045352 International Search Report and Written Opinion; 12 pages; Oct. 26, 2010.
International Search Report and Written Opinion mailed Feb. 6, 2009,. In counteprart PCT/US2008/008451, 13 pages.
European Search Report: dated Jan. 10, 2013 in corresponding EP application No. 09838022.3, 7 pages.

D. Ton and W. Bower; Summary Report of the DOE High-Tech Inverter Workshop; Jan. 2005.
First Action Interview Pre-Interview Communication from U.S. Appl. No. 13/174,495 mailed Jun. 18, 2014, 7 pgs.
Johnson et al., "Arc-fault detector algorithm evaluation method utilizing prerecorded arcing signatures", Photovoltaic Specialists Conference (PVSC), Jun. 2012.
Aug. 6, 2007—Philippe Welter, et al. "Electricity at 32 kHz," Photon International, The Photovoltaic Magazine, Http://www. photon-magazine.com/archiv/articles.aspx?criteria=4&HeftNr=0807 &Title=Elec . . . printed May 27, 2011).
PCT/US2009/069582 Int. Search Report—dated Aug. 19, 2010.
Chinese Office Action—CN Appl. 201210007491.3—mailed Apr. 25, 2016.
CN Office Action—CN Appl. 201310004123.8—dated May 5, 2016.
Law et al, "Design and Analysis of Switched-Capacitor-Based Step-Up Resonant Converters," IEEE Transactions on Circuits and Systems, vol. 52, No. 5, published May 2005.
CN Office Action—CN Appl. 201310066888.4—dated May 30, 2016.
European Search Report—EP Appl. 13152966.1—dated Jul. 21, 2016.
European Search Report—EP Appl. 12183811.4—dated Aug. 4, 2016.
European Notice of Opposition—EP Patent 2374190—dated Jul. 19, 2016.
"Es werde Dunkelheit. Freischaltung von Solarmodulen im Brandfall"— "Let there be Darkness: Quality control of Solar Modules in Case of Fire"; PHOTON, May 2005, 75-77, ISSN 1430-5348, English translation provided.
Chinese Office Action—CN Appl. 201380029450.7—dated Jul. 28, 2016.
Jan. 1, 2005; Linear Technology Specification Sheet, LTC3780— "High Efficiency Synchronous, 4-Switch Buck-Boost Controller".
Dec. 19, 2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
Jan. 29, 2019—European Search Report for EP App No. 18199117. 5.
Jul. 12, 2019—European Search Report—EP 19170538.3.
Sep. 4, 2019—Extended European Search Report—EP 19181247.8.
Aug. 6, 2019—Notice of Opposition of European Patent 2232663— Fronius International GmbH.
Sep. 5, 2019—Notice of Opposition of European Patent 2549635— Huawei Technologies Co.
Sep. 5, 2019—Notice of Opposition of European Patent 2549635— Fronius International GmbH.
Solide Arbeit, Heinz Neuenstein, Dec. 2007.
Spitzenwirkungsgrad mit drei Spitzen, Heinz Neuenstien and Andreas Schlumberger, Jan. 2007.
Technical Information, Temperature Derating for Sunny Boy, Sunny Mini Central, Sunny Tripower, Aug. 9, 2019.
Prinout from Energy Matters online Forum, Jul. 2011.
Wayback Machine Query for Energy Matters Online Forum Jul. 2011.
Nov. 27, 2019—European Search Report—3567562.
Baocheng, DC to AC Inverter with Improved One Cycle Control, 2003.
Brekken, Utility-Connected Power Converter for Maximizing Power Transfer From a Photovoltaic Source While Drawing Ripple-Free Current, 2002.
Cramer, Modulorientierter Stromrichter Geht In Serienfertigung , SPVSE, 1994.
Cramer, Modulorientierter Stromrichter, Juelich, Dec. 31, 1995.
Cramer, String-Wechselrichter Machen Solarstrom Billiger, Elektronik, Sep. 1996.
Dehbonei, A Combined Voltage Controlled and Current Controlled "Dual Converter" for a Weak Grid Connected Photovoltaic System with Battery Energy Storage, 2002.
Engler, Begleitende Untersuchungen zur Entwicklung eines Multi-String-Wechselrichters, SPVSE, Mar. 2002.

(56)                    References Cited

OTHER PUBLICATIONS

Geipel, Untersuchungen zur Entwicklung modulorientierter Stromrichter Modulorientierter Stromrichter für netzgekoppelte Photovoltaik-Anlagen, SPVSE, 1995.
Hoor, DSP-Based Stable Control Loops Design for a Single Stage Inverter, 2006.
Isoda, Battery Charging Characteristics in Small Scaled Photovoltaic System Using Resonant DC-DC Converter With Electric Isolation, 1990.
Jones, Communication Over Aircraft Power lines, Dec. 2006/ Jan. 2007.
Kalaivani, A Novel Control Strategy for the Boost DC-AC Inverter, 2006.
Lee, Powering The Dream, IET Computing & Control Engineering, Dec. 2006/ Jan. 2007.
Lee, A Novel Topology for Photovoltaic Series Connected DC/DC Converter with High Efficiency Under Wide Load Range, Jun. 2007.
Lin, LLC DC/DC Resonant Converter with PLL Control Scheme, 2007.
Niebauer, Solarenergie Optimal Nutzen, Stromversorgung, Elektronik, 1996.
Rodrigues, Experimental Study of Switched Modular Series Connected DC-DC Converters, 2001.
Sanchis, Buck-Boost DC-AC Inverter: Proposal for a New Control Strategy, 2004.
Sen, A New DC-to-AC Inverter With Dynamic Robust Performance, 1998.
Shaojun, Research on a Novel Inverter Based on DC/DC Converter Topology, 2003.
Siri, Sequentially Controlled Distributed Solar-Array Power System with Maximum Power Tracking, 2004.
Walko, Poised For Power, IEE Power Engineer, Feb./ Mar. 2005.
White, Electrical Isolation Requirements In Power-Over-Ethernet (POE) Power Sourcing Equipment (PSE), 2006.
Yu, Power Conversion and Control Methods for Renewable Energy Sources, May 2005.
Zacharias, Modularisierung in der PV-Systemtechnik-Schnittstellen zur Standardisierung der Komponenten, Institut für Solare Energieversorgungstechnik (ISET), 1996.
Dec. 24, 2019—CN Office Action—CN Application 201610946835.5.
Jan. 30, 2020—EP Office Action—EP 18204177.2.
Feb. 3, 2020—Chinese Office Action—201710749388.9.
Mar. 24, 2020—Non-Final Rejection—U.S. Appl. No. 15/593,761.
Apr. 20, 2020—European Search Report—EP 20151729.9.
Apr. 23, 2020—European Search Report—EP 19217486.0.
May 12, 2020—Extended European Search Report—EP 20161381.7.
Jul. 8, 2020—CN Office Action—CN 201710362679.2.
Sep. 17, 2020—Extended European Search Report—EP Application 20176744.9.
Oct. 12, 2020—CN Office Action—CN 201610946835.5.
Nov. 12, 2020—Preliminary Opinion by EPO—EP 12188944.8.
QT Technical Application Papers, "ABB Circuit-Breakers for Direct current Applications", ABB Sace S.p.A., An ABB Group Company, L.V. Breakers, Via Baioni, 35, 24123 Bergamo-Italy, Tel.: +39 035.395.111—Telefax: +39 035.395.306-433, Sep. 2007.
Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.
"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.
Fairchild Semiconductor, Application Note 9016, IGBT Basics 1, by K.S. OH Feb. 1, 2001.
"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.
Walker, "A DC Circuit Breaker for an Electric Vehicle Battery Pack", Australasian Universities Power Engineering Conference and IEAust Electric Energy Conference, Sep. 26-29, 1999.
Combined Search and Examination Report for GB1018872.0 dated Apr. 15, 2011, 2 pages.
International Search Report and Opinion of International Patent Application PCT/2009/051221, dated Oct. 19, 2009.
International Search Report and Opinion of International Patent Application PCT/2009/051222, dated Oct. 7, 2009.
Communication in EP07874025.5 dated Aug. 17, 2011.
IPRP for PCT/IB2008/055095 dated Jun. 8, 2010, with Written Opinion.
ISR for PCT/IB2008/055095 dated Apr. 30, 2009.
ISR for PCT/IL07/01064 dated Mar. 25, 2008.
IPRP for PCT/IB2007/004584 dated Jun. 10, 2009, with Written Opinion.
IPRP for PCT/IB2007/004591 dated Jul. 13, 2010, with Written Opinion.
IPRP for PCT/IB2007/004643 dated Jun. 10, 2009, with Written Opinion.
Written Opinion for PCT/IB2008/055092 submitted with IPRP dated Jun. 8, 2010.
IPRP for PCT/US2008/085754 dated Jun. 8, 2010, with Written Opinion dated Jan. 21, 2009.
IPRP for PCT/US2008/085755 dated Jun. 8, 2010, with Written Opinion dated Jan. 20, 2009.
IPRP for PCT/IB2009/051221 dated Sep. 28, 2010, with Written Opinion.
IPRP for PCT/IB2009/051222 dated Sep. 28, 2010, with Written Opinion.
IPRP for PCT/IB2009/051831 dated Nov. 9, 2010, with Written Opinion.
IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), Sep. 16, 2011.
UK Intellectual Property Office, Patents Act 1977: Patents Rules Notification of Grant: Patent Serial No. GB2480015, Nov. 29, 2011.
Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.

(56) References Cited

OTHER PUBLICATIONS

Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.

IPRP for PCT/IL2007/001064 dated Mar. 17, 2009, with Written Opinion dated Mar. 25, 2008.

IPRP for PCT/IB2007/004586 dated Jun. 10, 2009, with Written Opinion.

Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.

IPRP PCT/IB2007/004610—date of issue Jun. 10, 2009.

Extended European Search Report—EP12176089.6—Mailing date: Nov. 8, 2012.

Gwon-Jong Yu et al: "Maximum power point tracking with temperature compensation of photovoltaic for air conditioning system with fuzzy controller", 19960513; 19960513-19960517, May 13, 1996 ( May 13, 1996), pp. 1429-1432, XP010208423.

Extended European Search Report—EP12177067.1—Mailing Date: Dec. 7, 2012.

GB Combined Search and Examination Report—GB1200423.0—Mailing date: Apr. 30, 2012.

GB Combined Search and Examination Report—GB1201499.9—Mailing date: May 28, 2012.

GB Combined Search and Examination Report—GB1201506.1—Mailing date: May 22, 2012.

"Study of Energy Storage Capacitor Reduction for Single Phase PWM Rectifier", Ruxi Wang et al., Virginia Polytechnic Institute and State University, Feb. 2009.

"Multilevel Inverters: A Survey of Topologies, Controls, and Applications", José Rodriguez et al., IEEE Transactions on Industrial Electronics, vol. 49, No. 4, Aug. 2002.

Extended European Search Report—EP 08878650.4—Mailing date: Mar. 28, 2013.

Satcon Solstice—Satcon Solstice 100 KW System Solution Sheet—2010.

John Xue, "PV Module Series String Balancing Converters", University of Queensland—School of Information Technology & Electrical Engineering, Nov. 6, 2002.

Robert W. Erickson, "Future of Power Electronics for Photovoltaics", IEEE Applied Power Electronics Conference, Feb. 2009.

Ciobotaru, et al., Control of single-stage single-phase PV inverter, Aug. 7, 2006.

International Search Report and Written Opinion for PCT/IB2007/004591 dated Jul. 5, 2010.

European Communication for EP07873361.5 dated Jul. 12, 2010.

European Communication for EP07874022.2 dated Oct. 18, 2010.

European Communication for EP07875148.4 dated Oct. 18, 2010.

Chen, et al., "A New Low-Stress Buck-Boost Converter for Universal-Input PFC Applications", IEEE Applied Power Electronics Conference, Feb. 2001, Colorado Power Electronics Center Publications.

Chen, et al., "Buck-Boost PWM Converters Having Two Independently Controlled Switches", IEEE Power Electronics Specialists Conference, Jun. 2001, Colorado Power Electronics Center Publications.

Esram, et al., "Comparison of Photovoltaic Array Maximum Power Point Tracking Techniques", IEEE Transactions on Energy Conversion, vol. 22, No. 2, Jun. 2007, pp. 439-449.

Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.

Geoffrey R. Walker Affidavit re: U.S. Appl. No. 11/950,271, submitted in an IDS for U.S. Appl. No. 11/950,271 on Mar. 9, 2010.

International Search Report for PCT/IB2007/004610 dated Feb. 23, 2009.

International Search Report for PCT/IB2007/004584 dated Jan. 28, 2009.

International Search Report for PCT/IB2007/004586 dated Mar. 5, 2009.

International Search Report for PCT/IB2007/004643 dated Jan. 30, 2009.

International Search Report for PCT/US2008/085736 dated Jan. 28, 2009.

International Search Report for PCT/US2008/085754 dated Feb. 9, 2009.

International Search Report for PCT/US2008/085755 dated Feb. 3, 2009.

Kajihara, et al., "Model of Photovoltaic Cell Circuits Under Partial Shading", 2005 IEEE, pp. 866-870.

Knaupp, et al., "Operation of a 10 KW PV Façade with 100 W AC Photovoltaic Modules", 1996 IEEE, 25th PVSC, May 13-17, 1996, pp. 1235-1238, Washington, DC.

Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.

Chen, et al., "Predictive Digital Current Programmed Control", IEEE Transactions on Power Electronics, vol. 18, Issue 1, Jan. 2003.

Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.

Alonso, "A New Distributed Converter Interface for PV Panels", 20th European Photovoltaic Solar Energy Conference, Jun. 6-10, 2005, Barcelona, Spain, pp. 2288-2291.

Alonso, "Experimental Results of Intelligent PV Module for Grid-Connected PV Systems", 21st European Photovoltaic Solar Energy Conference, Sep. 4-8, 2006, Dresden, Germany, pp. 2297-2300.

Enslin, "Integrated Photovoltaic Maximum Power Point Tracking Converter", IEEE Transactions on Industrial Electronics, vol. 44, No. 6, Dec. 1997, pp. 769-773.

Sep. 7-9, 1999—Lindgren, "Topology for Decentralised Solar Energy Inverters with a Low Voltage AC-Bus", Chalmers University of Technology, Department of Electrical Power Engineering, EPE '99—Lausanne.

Jun. 20-25, 2004—Nikraz, "Digital Control of a Voltage Source Inverter in a Photovoltaic Applications", 2004 35th Annual IEEE Power Electronics Specialists Conference, Aachen, Germany, 2004, pp. 3266-3271.

Orduz, "Evaluation Test Results of a New Distributed MPPT Converter", 22nd European Photovoltaic Solar Energy Conference, Sep. 3-7, 2007, Milan, Italy.

Jun. 17-21, 2007—Palma, "A Modular Fuel Cell, Modular DC-DC Converter Concept for High Performance and Enhanced Reliability", IEEE 2007, pp. 2633-2638.

Sep. 16-19, 1996—Quaschning, "Cost Effectiveness of Shadow Tolerant Photovoltaic Systems", Berlin University of Technology, Institute of Electrical Energy Technology, Renewable Energy Section. EuroSun '96, pp. 819-824.

Roman, "Intelligent PV Module for Grid-Connected PV Systems", IEEE Transactions on Industrial Electronics, vol. 52, No. 4, Aug. 2006, pp. 1066-1073.

Roman, "Power Line Communications in Modular PV Systems", 20th European Photovoltaic Solar Energy Conference, Jun. 6-10, 2005, Barcelona, Spain, pp. 2249-2252.

Uriarte, "Energy Integrated Management System for PV Applications", 20th European Photovoltaic Solar Energy Conference, Jun. 6-10, 2005, Barcelona, Spain, pp. 2292-2295.

Walker, "Cascaded DC-DC Converter Connection of Photovoltaic Modules", IEEE Transactions on Power Electronics, vol. 19, No. 4, Jul. 2004, pp. 1130-1139.

Oct. 3-7, 1999—Matsui, et al., "A New Maximum Photovoltaic Power Tracking Control Scheme Based on Power Equilibrium at DC Link", IEEE, 1999, pp. 804-809.

Hou, et al., Application of Adaptive Algorithm of Solar Cell Battery Charger, Apr. 2004.

Sep. 15-22, 2000—Stamenic, et al., "Maximum Power Point Tracking for Building Integrated Photovoltaic Ventilation Systems".

(56)                References Cited

OTHER PUBLICATIONS

International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and The National Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
Chinese Office Action—CN Appl. 201310035221.8—dated Aug. 11, 2016.
Zhou, Wilson and Theo Phillips—"Industry's First 4-Switch Buck-Boost Controller Achieves Highest Efficiency Using a Single Inducutor—Design Note 369"—Linear Technology Corporation—www.linear.com—2005.
"Micropower Synchronous Buck-Boost DC/DC Converter"—Linear Technology Corporation—www.linear.com/LTC3440—2001.
Mar. 5-9, 1995—Caricchi, F. et al.—20 KW Water-Cooled Prototype of a Buck-Boost Bidirectional DC-DC Converter Topology for Electrical Vehicle Motor Drives—University of Rome—IEEE 1995—pp. 887-892.
Roy, Arunanshu et al—"Battery Charger using Bicycle"—EE318 Electronic Design Lab Project Report, EE Dept, IIT Bombay, Apr. 2006.
Jun. 20-25, 2004—Viswanathan, K. et al—Dual-Mode Control of Cascade Buck-Boost PFC Converter—35th Annual IEEE Power Electronics Specialists Conference—Aachen, Germany, 2004.
Zhang, Pei et al.—"Hardware Design Experiences in ZebraNet"—Department of Electrical Engineering, Princeton University—SenSys '04, Nov. 3-5, 2004.
"High Efficiency, Synchronous, 4-Switch Buck-Boost Controller"—Linear Technology Corporation—www.linear.com/LTC3780—2005.
May 19-24, 2002—Chomsuwan, Komkrit et al. "Photovoltaic Grid-Connected Inverter Using Two-Switch Buck-Boost Converter"—Department of Electrical Engineering, King Mongkut's Institute of Technology Ladkrabang, Thailand, National Science and Technology Development Agency, Thailand—IEEE—2002.
Midya, Pallab et al.—"Buck or Boost Tracking Power Converter"—IEEE Power Electronics Letters, vol. 2, No. 4—Dec. 2004.
Chinese Office Action—CN Appl. 201510111948.9—dated Sep. 14, 2016.

Chinese Office Action—CN Appl. 201310066888.4—dated Nov. 2, 2016.
"Power-Switching Converters—the Principle, Simulation and Design of the Switching Power (the Second Edition)", Ang, Oliva, et al., translated by Xu Dehong, et al., China Machine Press, Aug. 2010, earlier publication 2005.
European Notice of Opposition—EP Patent 2092625—mailed Nov. 29, 2016.
Mar. 8, 2003—Vishay Siliconix "Si 7884DP—n-Channel 40-V (D-S) MOSFET" (2003).
Chinese Office Action—CN 201510423458.2—mailed Jan. 3, 2017 (english translation provided).
Chinese Office Action—CN 201410098154.9—mailed Mar. 3, 2017 (english translation provided).
European Search Report—EP Appl. 13150911.9—Apr. 7, 2017.
Howard et al., "Relaxation on a Mesh: a Formalism for Generalized Localization." Proceedings of the IEEE/RSJ International Conference on Intelligent Robots and Systems (IROS 2001). Wailea, Hawaii, Oct. 2001.
Chinese Office Action and Search Report—CN 201510578586.4—mailed Apr. 19, 2017.
Jul. 13, 2017—Chinese Office Action—CN201210007491.3.
Jul. 31, 2014—Huimin Zhou et al.—"PV Balancers: Concept, Architectures, and Realization"—IEEE Transactions on Power Electronics, vol. 30, No. 7, pp. 3479-3487.
Sep. 15, 2012—Huimin Zhou et al.—"PV balancers: Concept, architectures, and realization"—Energy Conversion Congress and Exposition (ECCE), 2012 IEEE, IEEE pp. 3749-3755.
Jul. 17, 2017—International Search Report—PCT/US2017/031571.
Aug. 4, 2017—European Search Report—EP 17165027.
Jul. 19, 2016—Notice of Opposition—EP 2374190—EP App No. 08878650.4.
Sep. 28, 2017—European Office Action—EP 08857835.6.
Nov. 2, 2017—EP Search Report App No. 13157876.7.
Nov. 11, 2017—EP Search Report—App No. 17171489.2.
Dec. 14, 2017—EP Search Report App No. 17188362.2.
Dec. 15, 2017—EP Search Report App No. 17188365.5.
2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
Jan. 20, 2005; Duncan, Joseph, A Global Maximum Power Point Tracking DC-DC Converter, Massachussetts Institute of Technology, Dept. of Electrical Engineering and Computer Science Dissertation; 8 pages.
2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
2006; Esmaili, Gholamreza; "Application of Advanced Power Electornics in Renewable Energy Sources and Hygrid Generating Systems" Ohio State Univerty, Graduate Program in Electrical and Computer Engineering, Dissertation. 169 pages.
Nov. 13, 2007; Gomez, M; "Consulting in the Solar Power Age," IEEE-CNSV: Consultants' Network of Scilion Valley; 30 pages.
Jul. 25, 1995-Jun. 30, 1998; Kern, G; "SunSine (TM)300: Manufacture of an AC Photovoltaic Module," Final Report, Phases I & II; National Renewable Energy Laboratory, Mar. 1999; NREL-SR-520-26085; 33 pages.
May 1, 2000; Kroposki, H. Thomas and Witt, B & C; "Progress in Photovoltaic Components and Systems," National Renewable Energy Laboratory; NREL-CP-520-27460; 7 pages.
Jan. 22-23, 1998 Oldenkamp, H. et al; "AC Modules: Past, Present and Future" Workshop Installing the Solar Solution; Hatfield, UK; 6 pages.
Linear Technology Specification Sheet, LTC3443—"High Current Micropower 600kHz Synchronous Buck-Boost DC/DC Converter"—2004.
Linear Technology Specification Sheet, LTC3780—"High Efficiency Synchronous, 4-Switch Buck-Boost Controller"—2005.
Apr. 22, 2004—MICREL—MIC2182 High Efficiency Synchronous Buck Controller.
Apr. 1972—Methods for Utilizing Maximum Power From a Solar Array—Decker, DK.

(56) References Cited

OTHER PUBLICATIONS

2000—Evaluating MPPT converter topologies using a MATLAB PV model—Walker, Geoffrey.
Jun. 30, 2008—Wang, Ucilia; Greentechmedia; "National Semi Casts Solarmagic"; www.greentechmedia.com; 3 pages; accessed Oct. 24, 2017.
Sep. 2004; Yuvarajan, S; Dchuan Yu; Shanguang, Xu; "A Novel Power Converter for PHotovoltaic Applications," Journal of Power Sources; vol. 135, No. 1-2, pp. 327-331.
Jun. 1998—Stern M., et al., "Development of a Low-Cost Integrated 20-KW-AC Solar Tracking Subarray for Grid-Connected PV Power System Applications—Final Technical Report"—National Renewable Energy Laboratory; 41 pages.
1997; Verhoeve, C.W.G., et al., "Recent Test Results of AC_Module inverters," Netherlands Energy Research Foundation ECN, 1997; 3 pages.
2004—Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
Feb. 23-27, 1992—Miwa, Brett et al., "High Efficiency Power Factor Correction Using Interleaving Techniques"—Applied Power Electronics Conference and Exposition, 1992. APEC '92. Conference Proceedings 1992., Seventh Annual.
Mar. 4-8, 2001—Andersen Gert, et al.,—Aalborg University, Institute of Energy Technology, Denmark—"Currect Programmed Control of a Single Phase Two-Switch Buck-Boost Power Factor Correction Circut"—Applied Power Electronics Conference and Exposition, 2001. APEC 2001. Sixteenth Annual IEEE.
Feb. 22-26, 2004—Andersen, Gert et al.,—"Utilizing the free running Current Programmed Control as a Power Factor Correction Technique for the two switch Buck-Boost converter"—Applied Power Electronic Conference and Exposition, 2004. APEC '04. Nineteenth Annual IEEE.
Mar. 3-7, 1996—Caricchi F et al.,—"Prototype of Innovative Wheel Direct Drive With Water-Cooled Exial-Flux Motor for Electric Vehicle Applications"—Applied Power Electronics Conference and Expositions, 1996. APEC '96. Conference Proceedings 1996., Eleventh Annual IEEE.
Feb. 15-19, 1998—Caricchi, F. et al.,—"Study of Bi-Directional Buck-Boost Converter Topologies for Application in Electrical Vehicle Motor Drives"—Applied Power Electronics Conference and Exposition, 1998, APEC '98. Conference Proeedings 1998., Thirteenth Annual IEEE.
Nov. 27-30, 1990—Ensling, JHR—"Maximum Power Point Tracking: A Cost Saving Necessity in Solar Energy Systems"—Industrial Electornics Society, 1990. IECON '90., 16th Annual Conference of IEEE.
Feb. 22-26, 2004—Gaboriault, Mark et al.,—"A High Efficiency, Non-Inverting, Buck-Boost DC-DC Converter"—Applied Power Electronics Conference and Exposition, 2004. APEC '04. Nineteenth Annual IEEE.
Feb. 15-19, 1998—Hua, et al.,—"Comparative Study of Peak Power Tracking Techniques for Solar Storage System"—Applied Power Electronics Conference and Exposition, 1998. APEC'98. Conferenced Proceedings 1998., Thirteenth Annual IEEE.
Jun. 20-24, 1993—Sullivan, et al., "A High-Efficiency Maximum Power Point Tracker for Photovoltaic Arrays in a Solar-Powered Race Vehicle"—University of California, Berkeley, Department of Electrical Engineering and OCmputer Sciences—Power Electronics Specialists Conference, 1993. PESC '93 Record., 24th Annual IEEE.
May 19-24, 2002—Bower et at.,—"Certification of Photovoltaic Inverters: The Initial Step Toward PV System Certification"—Photovoltaic Specialists Conferences, 2002. Conference Record of the Twenty-Ninth IEEE.
Jun. 17-21, 2001—Tse et al., "A Novel Maximum Power Point Tracking Technique for PV Panels"—Power Electronics Specialists Conferences, 2001. PESC. 2001 IEEE 32nd Annual.

May 12-18, 2008—Cuadras et al., "Smart Interfaces for Low Power Energy Harvesting Systems"—Instrumentation and Measurement Technology Conferences Proceedings, 2008. IMTC 2008. IEEE.
Dec. 5-9, 1994—Haan, et al., "Test Results of a 130 W AC Module; a modular solar as power station"—Photovoltaic Energy Conversion 1994. Conference Record of the Twenty Fourth. IEEE Phtovoltaic Specialists Conference—1994.
Sep. 1-3, 2008—Jung, et al., "Soft Switching Boost Converter for Photovoltaic Power Generation System"—Power Electronics and Motion Control Conference, 2008. EPE-PEMC 2008.
Jun. 3-5, 2008—Duan, et al., "A Novel High-Efficiency Inverter for Stand Alone and Grid-Connected Systems"—Industrial Electronics and Applications, 2008. ICIEA 2008.
Nov. 7, 2002—Ertl, et al., "A Novel Multicell DC-AC Converter for Applicaiton in Renewable Energy Systems"—IEEE Transactions on Industrial Electronics (vol. 49, Issue 5, Oct. 2002).
Oct. 8-12, 2000 Hashimoto, et al., "A Novel High Peforamance Utility Interactive Photovoltain Inverter System"—Industry Applications Conference, 2000. Conference Record of the 2000 IEEE.
Feb. 22-26, 2004—Ho, et al., "An Integrated Inverter with Maximum Power Tracking for Grid-Connected PV Systems"—Applied Power Electronics Conference and Exposition, 2004. APEC '04. Nineteenth Annual IEEE.
Nov. 14, 1997 Hua et al., "Control of DC/DC Converters for Solar Energy System with Maximum Power Tracking"—Industrial Electronics, Control and Instrumentation, 1997. IECON 97. 23rd International Conference on Industrial Electronics, Control and Instrumentation vol. 4 of 4.
Sep. 1-3, 2008 Lee et al., "Soft Switching Mutli-Phase Boost Converter for Photovoltaic System"—Power Electronics and Motion Control Conference, 2008. EPE-PEMC 2008.
Jul. 5, 2005, Yao et al., "Tapped-Inductor Buck Converter for High-Step-Down DC-DC Conversion" IEEE Transactions on Power Electronics (vol. 20, Issue 4, Jul. 2005).
Sep. 21-23, 1998 Kretschmar, et al., "An AC Converter with a Small DC Link Capacitor for a 15KW Permanent Magnet Synchronous Integral Motor"—Power Electronics and Variable Speed Drives, 1998. Sevent International Converterest (Conf. Publ. No. 456).
May 25, 2000—Hong Lim, et al., "Simple Maximum Power Point Tracker for Photovoltaic Arrays"—Electronics Letters (vol. 36, Issue 11, May 25, 2000).
Aug. 14-16, 2004 Nishida et al., "A Novel Type of Utility-Interactive Inverter for Phtovoltaic System"—Power Electronics and Mtion Control Conference, 2004. IPEMC 2004.
May 30-Jun. 3, 2011 Jung, et al., "DC-Link Ripple Reduction of Series-connected Module Integrated Converter for Photovoltaic Systems."—Power Electronics and ECCE Asia (ICPE & ECCE).
Jan. 8, 2007, Li et al., "An Analysis of ZVS Two-Inductor Boost Converter under Variable Frequency Operation"—IEEE Transactions on Power Electronics (vol. 22, Issue 1, Jan. 2007).
Sep. 17, 2007 Rodriguez et al., "Analytic Solution to the Photovoltaic Maximum Power Point Problem"—IEEE Transactions on Circuits and Systems I: Regular Papers (vol. 54, Issue 9, Sep. 2007).
Jun. 27, 1997, Reimann et al., "A Novel Control Principle of Bi-Directional DC-DC Power Conversion"—Powre Electronics Specialists Conference 1997. PESC '97 Record.
Sep. 15-22, 2000 Russell et al., "The Massachusetts Electric Solar Project: A Pilot Project to Commercialize Residential PV Systems"—Photovoltaic Specialists Conference, 2000, Conference Record of the Twenty-Eighth IEEE Photovoltaic Specialists Conference—2000.
May 2001, Shimizu et al., "Generation Control Circuit for Photvoltaic Modules"—IEEE Transactions of Power Electronics (vol. 16, Issue 3, May 2001).
Feb. 6-10, 2000, Siri, Kasemsan "Study of System Instability in Current-Mode Converter Power Systems Operating in Solar Array Voltage Regulation Mode"—Applied Power Electronics Conference and Exposition, 2000. APEC 2000. Fiftheenth Annual IEEE.
Aug. 13-16, 1990—Rajan, Anita "A Maximum Power Point Tracker Optimized for Solar Powered Cars"—Future Transportation Technology Conference and Expostion.
Jul. 10, 1995—"Battery I.D. chip from Dallas Semiconductor monitors and reports battery pack temperature"—Business Wire.

(56) References Cited

OTHER PUBLICATIONS

Nov. 3, 1999—Takahashi et al., "Development of a Long-Life Three-Phase Flywheel UPS Using an Electrolytic Capacitorless Converter/Inverter"—Electrical Engineering in Japan, vol. 127.

Jan. 2001—Walker, Geoffrey "Evaluating MPPT Converter Topologies Using a Matlab PV Model"—"Journal of Electrical and Electronics Engineering, Australia".

Feb. 13, 2007—Roman et al., "Experimental Results of Controlled PV Module for Building Integrated PV Systems"—Solar Energy 82 (2008) 471-480.

2006—Bower et al., "Innovative PV Micro-Inverter Topology Eliminates Electrolytic Capacitors for Longer Lifetime"—IEEE 1-4244-0016-3/06/ pp. 2038-2041.

Aug. 23-27, 1993—Case et al., "A Minimum Component Photovoltaic Array Maximum Power Point Tracker"—European Space Power Conference vol. 1. Power Systems, Power Electronics.

Jun. 4, 1997—Maranda et al., "Optimization of the Master-Slave Inverter System for Grid-Connected Photovoltaic Plants"—Energy Convers. Mgmt. vol. 39, No. 12 pp. 1239-1246.

2005—Kang et al., "Photovoltaic Power Interface Circuit Incorporated with a Buck-Boost Converter and a Full-Bridge Inverter"—Applied Energy 82, pp. 266-283.

Nov. 21, 1997—Feuermann et al., "Reversable Low Soalr Heat Gain Windows for Energy Savings"—Solar Energy vol. 62, No. 3 pp. 169-175.

May 16, 2005—Enrique et al., "Theoretical assessment of the maximum power point tracking efficiency of photovoltaic facilities with different converter topologies"—Solar Energy 81 (2007) p. 31-38.

Dehbonei, Hooman "Power Conditioning for Distrbuted Renewable Energy Generation"—Curtin University of Technology, School of Electrical and Computer Engineering, 2003 568 pages Dissertation: Thesis. Abstract, 1 page—retrieved on Nov. 13, 2017 on https://books.google.com/books/about/Power_Conditioning_for_Distributed_Renew.html?id=3wVXuAAACAAJ.

Korean Patent Application No. 102005-7008700, filed May 13, 2015. Applicant: Exar Corporation.

Jan. 23, 2018—EP Search Report, EP App No. 17187230.2.

Apr. 16, 2018—EP Examination Report 12707899.6.

Aug. 9, 2010 Hong, Wei, et al., "Charge Equalization of Battery POwer Modules in Series" The 2010 International Power Electronics Conference, IEEE, p. 1568-1572.

Jun. 6, 2018—EP Search Report EP App No. 18151594.1.

Jun. 29, 2018—EP Search Report—EP App No. 18175980.4.

Jun. 23, 2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.

Oct. 3-7, 2004; Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.

GB Combined Search and Examination Report—GB1203763.6—Mailing date: Jun. 25, 2012.

Mohammad Reza Amini et al., "Quasi Resonant DC Link Inverter with a Simple Auxiliary Circuit", Journal of Power Electronics, vol. 11, No. 1, Jan. 2011.

Khairy Fathy et al., "A Novel Quasi-Resonant Snubber-Assisted ZCS-PWM DC-DC Converter with High Frequency Link", Journal of Power Electronics, vol. 7, No. 2, Apr. 2007.

May 22, 1998—Cheng K.W.E., "New Generation of Switched Capacitor Converters", Department of Electrical Engineering, The Hong Kong Polytechnic University, Hung Hom, Hong Kong, Power Electronics Conference, PESC 98.

1999—Per Karlsson, "Quasi Resonant DC Link Converters—Analysis and Design for a Battery Charger Application", Universitetstryckeriet, Lund University, 1999, ISBN 91-88934-14-4; Added to Lund University Publications on Jun. 4, 2012.

Hsiao Sung-Hsin et al., "ZCS Switched-Capacitor Bidirectional Converters with Secondary Output Power Amplifier for Biomedical Applications", Power Electronics Conference (IPEC) Jun. 21, 2010.

Nov. 27-30, 2007—Yuang-Shung Lee et al., "A Novel QR ZCS Switched-Capacitor Bidirectional Converter", IEEE, 2007.

Antti Tolvanen et al., "Seminar on Solar Simulation Standards and Measurement Principles", May 9, 2006 Hawaii.

J.A. Eikelboom and M.J. Jansen, "Characterisation of PV Modules of New Generations—Results of tests and simulations", Jun. 2000.

Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.

C. Liu et al., "Advanced Algorithm for Mppt Control of Photovoltaic Systems", Canadian Solar Buildings Conference, Montreal, Aug. 20-24, 2004.

May 22, 1998—Chihchiang Hua and Chihming Shen, "Study of Maximum Power Tracking Techniques and Control of DC/DC Converters for Photovoltaic Power System", IEEE.

Tore Skjellnes et al., "Load sharing for parallel inverters without communication", Nordic Workshop in Power and Industrial Electronics, Aug. 12-14, 2002.

Jun. 23, 2000—Giorgio Spiazzi at el., "A New Family of Zero-Current-Switching Variable Frequency dc-dc Converters", IEEE.

Nayar, C.V., M. Ashari and W.W.L Keerthiphala, "A Grid Interactive Photovoltaic Uninterruptible Power Supply System Using Battery Storage and a Back up Diesel Generator", IEEE Transactions on Energy Conversion, vol. 15, No. 3, Sep. 2000, p. 348?353.

Ph. Strauss et al., "AC coupled PV Hybrid systems and Micro Grids-state of the art and future trends", 3rd World Conference on Photovoltaic Energy Conversion, Osaka, Japan May 11-18, 2003.

Jul. 16-20, 2000—Nayar, C.V., abstract, Power Engineering Society Summer Meeting, 2000. IEEE, 2000, pp. 1280-1282 vol. 2.

Mar. 15, 2004—D. C. Martins et al., "Analysis of Utility Interactive Photovoltaic Generation System using a Single Power Static Inverter", Asian J. Energy Environ., vol. 5, Issue 2, (2004), pp. 115-137.

Rafael C. Beltrame et al., "Decentralized Multi String Pv System With Integrated ZVT Cell", Congresso Brasileiro de Automática / 12 a 16-setembro-2010, Bonito-MS.

Sergio Busquets-Monge et al., "Multilevel Diode-clamped Converter for Photovoltaic Generators With Independent Voltage Control of Each Solar Array", IEEE Transactions On Industrial Electronics, vol. 55, No. 7, Jul. 2008.

Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.

Office Action—JP 2011-539491—Mailing date: Mar. 26, 2013.

Supplementary European Search Report—EP08857456—Mailing Date Dec. 6, 2013.

Extended European Search Report —EP14151651.8—Mailing date: Feb. 25, 2014.

Iyomori H et al: "Three-phase bridge power block module type auxiliary resonant AC link snubber-assisted soft switching inverter for distributed AC power supply", Intelec 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.

Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http:jscholar.lib.vt.edu/theses/available/etd-012299-165108/unrestricted/THESIS. PDF, [retrieved on Mar. 5, 2013].

Yoshida M et al: "Actual efficiency and electromagnetic noises evaluations of a single inductor resonant AC link snubber-assisted three-phase soft-switching inverter", Intelec 2003. 25th. International Telecommunications Energy Conference. Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.

Third party observation—EP07874025.5—Mailing date: Aug. 6, 2011.

Extended European Search Report—EP 13152967.9—Mailing date: Aug. 28, 2014.

(56)         References Cited

OTHER PUBLICATIONS

Extended European Search Report—EP 14159696—Mailing Date: Jun. 20, 2014.

Gow Ja A et al: "A Modular DC-DC Converter and Maximum Power Tracking Controller For Medium to Large Scale Photovoltaic Generating Plant" 8$^{th}$ European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.

Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.

Matsuo H et al: "Novel Solar Cell Power Supply System Using the Multiple-input DC-DC Converter" 20$^{th}$ International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.

Chihchiang Hua et al: "DSP-based controller application in battery storage of photovoltaic system" Industrial Electronics, Control, and Instrumentation, 1996, Proceedings of the 1996 IEEE IECON 22$^{nd}$ International Conference on Taipei, Taiwan Aug. 5-10, 1996, New York, NY, USA, IEEE, US, Aug. 5, 1996, pp. 1705-1710, XP010203239.

Hua C et al: "Implementation of a DSP-Controlled Photovoltaic System with Peak Power Tracking" IEEE Transactions on industrial Electronics, IEEE, Inc. New York, US, vol. 45, No. 1, Feb. 1, 1998, pp. 99-107, XP000735209.

I. Weiss et al.: "A new PV system technology-the development of a magnetic power transmission from the PV module to the power bus" 16th European Photovoltaic Solar Energy Conference, vol. III, May 1-5, 2000, pp. 2096-2099, XP002193468 Glasgow, UK cited in the application.

Basso, Tim, "IEEE Standard for Interconnecting Distributed Resources With the Electric Power System," IEEE PES Meeting, Jun. 9, 2004.

Feb. 11, 2003—Boostbuck. com, "The Four Boostbuck Topologies," located at http://www.boostbuck.com/TheFourTopologies. html.

Apr. 2002—Gautam, Nalin K. et al., "An Efficient Algorithm to Simulate the Electrical Performance of Solar Photovoltaic Arrays," Energy, vol. 27, No. 4, pp. 347-361, 2002.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Wiles, John, "Photovoltaic Power Systems and the National Electrical Code: Suggested Practices," Sandia National Laboratories, document No. SAND2001-0674, Mar. 2001.

Hewes, J. "Relays," located at http://web.archive.org/web/20030816010159/www.kpsec.freeuk.com/components/relay. htm, Aug. 16, 2003.

Jan. 1, 1993—Definition of "remove" from Webster's Third New International Dictionary, Unabridged, 1993.

Jan. 1, 1993—Definition of "removable" from Webster's Third New International Dictionary, Unabridged, 1993.

Advanced Energy Group, "The Basics of Solar Power Systems," located at http://web.archive.org/web/20010331044156/http://www. solar4power.com/solar-power-basics.html, Mar. 31, 2001.

International Patent Application No. PCT/AU2005/001017, International Search Report and Written Opinion, Aug. 18, 2005.

Baek, Ju-Won et al., "High Boost Converter using Voltage Multiplier," 2005 IEEE Conference, IECON 05, pp. 567-572, Nov. 2005.

Wikimedia Foundation, Inc., "Electric Power Transmission," located at http://web.archive.org/web/20041210095723/en.wikipedia.org/ wiki/Electric-power-transmission, Nov. 17, 2004.

Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.

Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.

Figures 1C, 1D:
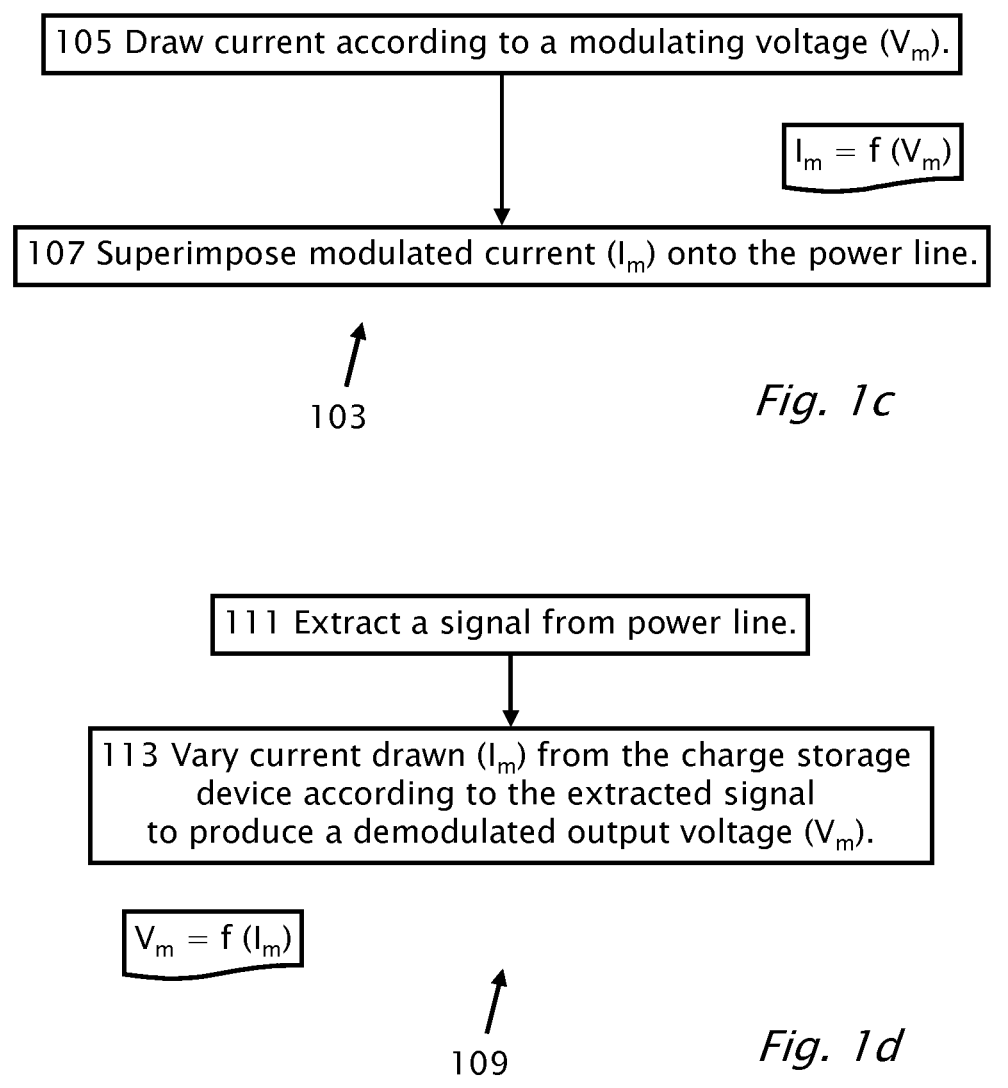

105 Draw current according to a modulating voltage ($V_m$).

$$I_m = f\ (V_m)$$

107 Superimpose modulated current ($I_m$) onto the power line.

111 Extract a signal from power line.

113 Vary current drawn ($I_m$) from the charge storage
device according to the extracted signal
to produce a demodulated output voltage ($V_m$).

PAIRING OF COMPONENTS IN A DIRECT CURRENT DISTRIBUTED POWER GENERATION SYSTEM

CROSS-REFERENCE TO RELATED APPLICATIONS

This application is a continuation of U.S. application Ser. No. 18/338,527, filed Jun. 21, 2023, which is a continuation of U.S. application Ser. No. 17/398,840, filed Aug. 10, 2021, now U.S. Pat. No. 11,728,768, which is a continuation of U.S. application Ser. No. 15/949,369, filed Apr. 10, 2018, which is a continuation of U.S. application Ser. No. 14/743, 018, filed Jun. 18, 2015, now U.S. Pat. No. 9,960,731, which is a continuation of U.S. application Ser. No. 13/015,612, filed Jan. 28, 2011, now U.S. Pat. No. 9,112,379. The entire disclosures of the foregoing applications are incorporated by reference in their entireties.

FIELD AND BACKGROUND

1. Field

The present invention relates to power generation systems, and specifically to a system and method for reducing crosstalk while signaling between the components in direct current distributed power generation systems.

2. Related Art

A photovoltaic power generation system may incorporate one or more photovoltaic panels with optional electronic modules attached thereto. An inverter connects to the photovoltaic panels or electronic modules. Power output from the photovoltaic panels or electronic modules is direct current (DC) power. The electronic modules may perform direct current DC-to-DC conversion. The inverter inverts the DC power output to alternating current (AC) power.

As previously disclosed by the present inventors in US patent application publication 2008/0147335, the DC power cables connecting inverters to photovoltaic panels and/or electronic modules may provide a communication channel between the inverters and the photovoltaic panels or modules. The communication channel between inverters and modules, allows monitoring of the performance of the modules for monitoring temperature, current, voltage and power output of the photovoltaic modules and potentially allows for control of the modules.

Typically, lengths of cables connecting the inverter to the panels or modules may be long and may contain one or several wire cores. Within a photovoltaic installation, a wire at positive potential and a wire at negative potential electrically associated therewith may be physically proximate thereto only at a point of connection to a piece of equipment. However, elsewhere in the photovoltaic field, the wires may be separated and not be within the same cable run. The topography of the distributed power generation system to a large extent dictates the installation and placement of cable runs. Physical proximity of wires not having an electrical association may increase the chances of the wires in the cables being subject to the effects of noise if those wires are to be considered for signaling by DC power line communications. Crosstalk is a type of noise which refers to any phenomenon by which a signal transmitted on a cable, circuit or channel of a transmission system creates an undesired effect in another cable, circuit or channel. Crosstalk is usually caused by undesired capacitive, inductive, or conductive coupling from one cable, circuit or channel, to another. Crosstalk may also corrupt the data being transmitted. Typical known methods of preventing the undesirable effects of crosstalk may be to utilize the shielding of cables, modules, panels, inverters or using twisted pair cables. Additionally, filtering techniques such as matched filters, de-coupling capacitors or chokes may be used to prevent the undesirable effects of crosstalk. However, these typical ways of preventing the undesirable effects of crosstalk are typically unavailable or impractical for power line communications over DC lines in a power generation system and/or may be prohibitively expensive in terms of additional materials and/or components required.

In a photovoltaic power generation system, with power line communication over DC cables, it may be desirable to send a control signal between and an inverter and a particular photovoltaic module but no other modules. Crosstalk may cause the other photovoltaic modules in the power generation system to inadvertently receive the control signal which is of course undesirable.

Thus there is a need for and it would be advantageous to have a system and method of reducing cross-talk in DC power line communications in a distributed DC power generation system, e.g. photovoltaic DC power generation system.

The term "memory" as used herein refers to one or more of programmable read only memory (PROM), erasable programmable read only memory (EPROM), electrically erasable programmable read only memory (EEPROM), FLASH memory, optical memory, e.g. compact disk, switches, random access memory (RAM), magnetic memory such as a hard disk or other memory types known in the art.

The term "direct current (DC) power source" as used herein refers to (DC) power source such as batteries, DC motor generator; switch mode power supply (SMPS), photovoltaic panels and/or photovoltaic panels operatively attached to a converter module such as a DC to DC converter.

The term "photovoltaic source" as used herein refers to a photovoltaic panel and/or a photovoltaic panel operatively attached to a electronic module which includes for instance a DC-to-DC converter. The term "electronic module" and "photovoltaic module" are used herein interchangeably and refer to a functional electronic circuit attached to a photovoltaic panel.

The term "noise" as used herein in a communication channel, includes any unwanted signal finding itself in the communication channel. Sources of noise may include radio frequency interference (RPI), mains electricity hum, unsuppressed switching voltages and crosstalk.

The term "crosstalk" as used herein refers to any phenomenon by which a signal transmitted on a cable, circuit or channel of a transmission system creates an undesired effect in another cable, circuit or channel. Crosstalk is usually caused by undesired capacitive, inductive, or conductive coupling from one cable, a circuit, part of a circuit, or channel, to another.

The term "telemetry" as used herein refers to measurement, transmission and reception of data by wire, radio, or other means from remote sources. In the context of the present invention, telemetries are from the photovoltaic panels.

The term "transducer" as used herein refers to a device used for the conversion of one type of energy to another, for example, the device changes electrical energy in to electromagnetic energy and vice versa. The term "transducer"

herein may also have functions of a sensor or detector. The terms "sensor" and "transducer" as used herein are used interchangeably.

The terms "signal", "signaling" or "signaling mechanism" as used herein refers to a signal modulated on a carrier signal. The carrier signal may be an electrical or an electromagnetic signal. The signal may be a simple on/off signal or a complex signal which imparts information as data. For a modulated signal, the modulation method may be by any such method known in the art, by way of example, frequency modulation (FM) transmission, amplitude modulation (AM), FSK (frequency shift keying) modulation, PSK (phase shift keying) modulation, various QAM (quadrature amplitude modulation) constellations, or any other method of modulation. Although strictly, the terms "modulation" and "coding" are not equivalent, the term modulation and demodulation are typically used herein to include coding and decoding respectively.

The term "signal strength" as used herein refers to the magnitude of the electric field/current or voltage at a reference point that is a significant distance from a transmitting source. Typically, "signal strength" is expressed in voltage per length or signal power received by a reference point expressed in decibel (dB) per length (meter), dB-millivolts per meter (dBm V/m), and dB-microvolts per meter (dBµ V/m) or in decibels above a reference level of one milliwatt (dBm).

The term "positive comparison" in reference to the comparison of two codes or two signals means equal within tolerances or thresholds or derivable one from the other in a known way.

BRIEF SUMMARY

According to the present invention there is provided a method of signaling between a photovoltaic module and an inverter module. The inverter module is connected to the photovoltaic module. In an initial mode of operation an initial code is modulated to produce an initial signal. The initial signal is transmitted from the inverter module to the photovoltaic module. The initial signal is received by the photovoltaic module. The operating mode is then changed to a normal mode of power conversion, and during the normal mode of operation a control signal is transmitted from the inverter to the photovoltaic module. A control code is demodulated and received from the control signal. The control code is compared with the initial code producing a comparison. The control command of the control signal is validated as a valid control command from the inverter module with the control command only acted upon when the comparison is a positive comparison. Current output of photovoltaic modules may be limited during the initial mode of operation. The initial code is typically saved in a memory. Modulating the code may be performed by varying the input impedance of the inverter module to produce a variation in voltage or current at the output of the photovoltaic module. The photovoltaic module senses the variation in voltage or current at the output of the photovoltaic module. Respective signal strengths for the initial signal and the control signal may be measured. The signal strengths are compared to produce a comparison result. When the comparison result is greater than a previously stored threshold value then an alarm is set or the control command is invalidated. Fluctuations prior to measuring the signal strength are preferably filtered out. Electrical energy is typically stored for supplying power for the varying and the sensing.

According to the present invention there is provided a photovoltaic generation system with a photovoltaic module including a first transceiver connected to the DC power line. A load module is connected to the DC power line. The load module including a second transceiver is connected to the DC power line. There is a pairing mechanism and a signaling mechanism between the first and second transceivers. Based on the pairing mechanism, another photovoltaic module or another load module in the photovoltaic generation system is excluded from signaling with either the photovoltaic module or the load module. A charge storage device may be included within the photovoltaic module adapted to store charge and supply power to the photovoltaic module. A second photovoltaic module may be attached to the photovoltaic module along with a second signaling mechanism adapted to signal between the photovoltaic module and the second photovoltaic module. The signaling mechanism is typically configured to signal controls to the second photovoltaic module by relaying commands through the second signal mechanism. The signaling mechanism may also be configured to monitor the second photovoltaic module by receiving telemetries through the second signal mechanism. A transducer is optionally connected to the DC power line and the first transceiver to modulate/demodulate a signal onto/from said power line and a sensor may be connected to the DC power line and the second transceiver to demodulate/modulate the signal from/onto said power line. In an initial mode of operation, an initial signal from the load module is transmitted to the photovoltaic module and an initial code is demodulated by the photovoltaic module. In a subsequent normal mode of operation the initial code is used to validate a control command from the load module. A memory may also be included within the photovoltaic module, the memory preferably adapted to store the initial code.

The foregoing and/or other aspects will become apparent from the following detailed description when considered in conjunction with the accompanying drawing figures.

BRIEF DESCRIPTION OF THE DRAWINGS

The invention is herein described, by way of example only, with reference to the accompanying drawings, wherein:

FIG. 1c and 1d illustrate respective methods of modulation and demodulation according to aspects of the present invention.

DETAILED DESCRIPTION

Figure 1A:
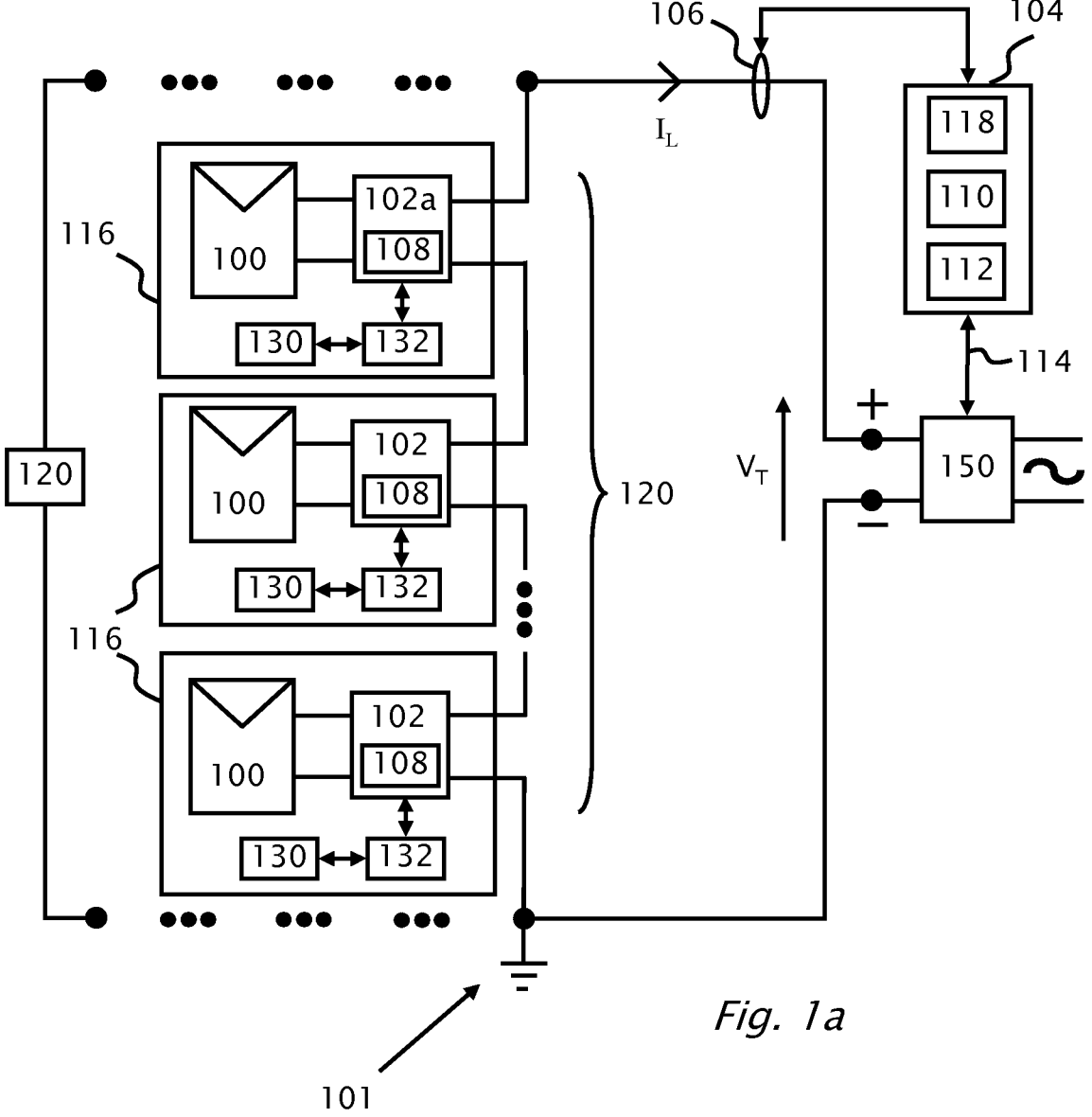
FIG. 1a shows a power generation circuit according to an embodiment of the present invention.

Reference will now be made in detail to embodiments of the present invention, examples of which are illustrated in the accompanying drawings, wherein like reference numerals refer to the like elements throughout. The embodiments are described below to explain the present invention by referring to the figures.

It should be noted, that although the discussion herein relates primarily to methods in photovoltaic systems, the present invention may, by non-limiting example, alternatively be configured as well using other distributed power systems including (but not limited to) wind turbines, hydroturbines, fuel cells, storage systems such as battery, superconducting flywheel, and capacitors, and mechanical devices including conventional and variable speed diesel engines, Stirling engines, gas turbines, and micro-turbines.

It should be noted that although embodiments of the present invention are described in terms of an inverter as a load, the present invention may be applied equally well to other loads including non-grid tied applications such as battery chargers and DC-DC power converters.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

The term "pairing or paired" as used herein refers to at least two power generation system components such as an inverter on one side, and on the other side photovoltaic panels and/or electronic modules which are "paired" or associated with each other. "Pairing" establishes an association between an inverter and a particular set of one or more photovoltaic panels and/or electronic modules. The "pairing" between power generation components is typically performed via initial assignment of codes and storage within each power generation component. The "pairing" process may take place at the time of manufacture of power generation system components, during installation of a power generation system, during the operation of the power generation system and/or after an upgrade/modification to the power generation system. The storage of codes typically establishes the electrical connections and future communication protocols of signaling.

Referring now to the drawings, reference is now made to FIG. 1a which shows a power generation circuit 101 according to an embodiment of the present invention. Two photovoltaic strings 120, by way of example, are connected in parallel to an inverter 150. Details of only one of strings 120 are shown explicitly. In each of strings 120, direct current power sources 116 are serially connected. Each direct current power source 116 includes a photovoltaic panel 100 connected to an electronic module or photovoltaic module 102. Outputs of photovoltaic modules 102 are connected in series to form serial string 120. Photovoltaic modules 102 may be direct current (DC) to DC converters such as a buck circuit, boost circuit, buck/boost or buck+ boost circuit or any other known switching converter topology Attached to photovoltaic modules 102 is a processor 132 which accesses a memory 130. A transceiver 108 is attached to the output of electronic module 102 and to processor 132. According to a feature of the present invention, one of photovoltaic modules 102 referenced 102a is a master electronic module 102a of string 120 and controls and communicates with the other modules, i.e. slave modules 102 via power line communications or wireless link.

Load 150 is typically a direct current (DC) to alternating current (AC) inverter. String 120 attaches across the input of load 150. The output of load 150 is typically attached to an AC grid voltage. Attached to load 150 is inverter module 104. Inverter module 104 contains a memory module 110, transceiver 118 and control unit 112. Inverter module 104 is attached to load 150 with bi-directional connection 114. Transducer 106 is attached to the power connection to load 150 and provides a signal to inverter module 104.

Figure 2:
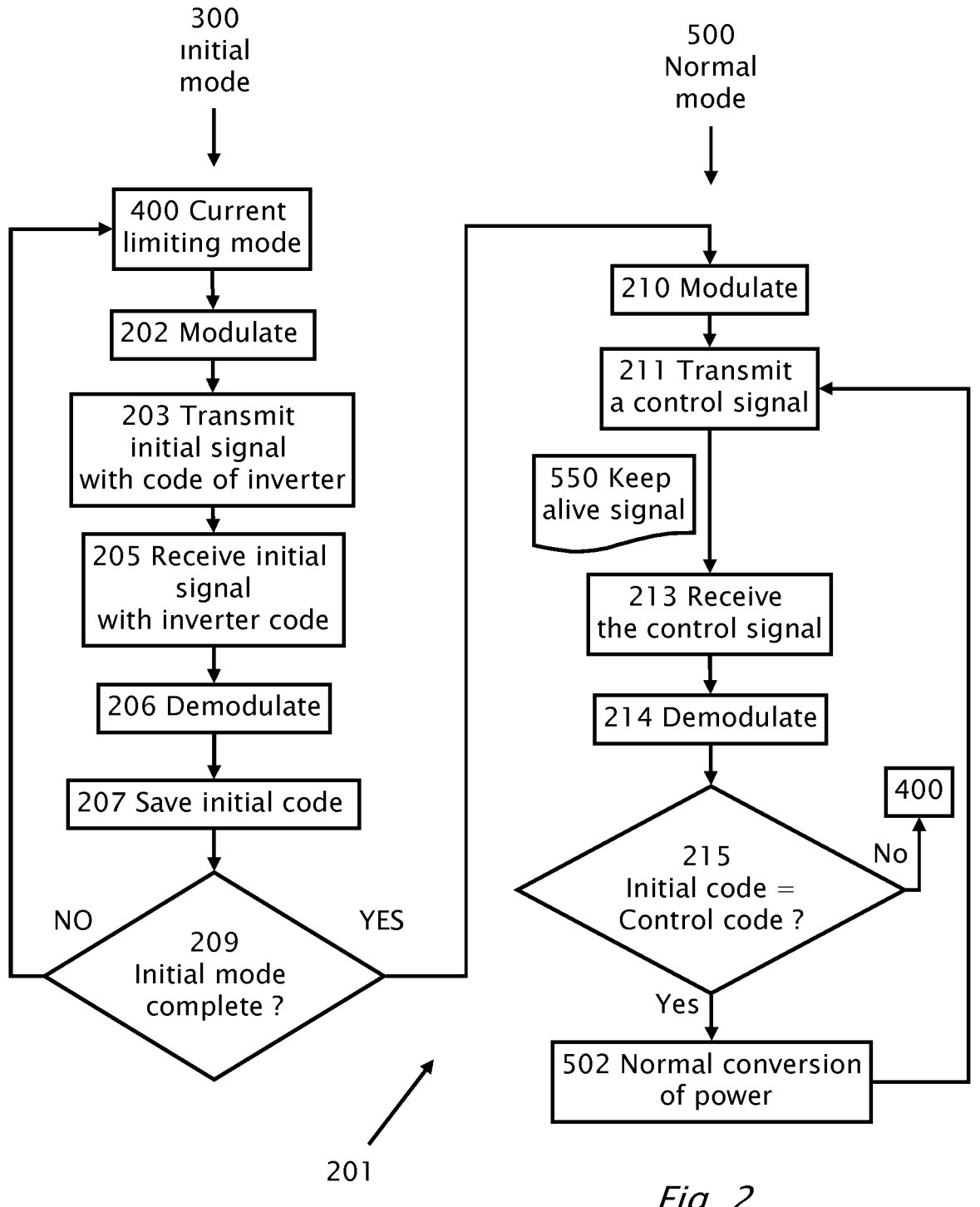
FIG. 2 shows a method according to an embodiment of the present invention.

Reference is now made to FIG. 2 which shows a method 201 according to an embodiment of the present invention. Method 201 mitigates the detrimental effects of crosstalk in the communication channel along the power lines connecting photovoltaic modules 102 with inverter module 104. Method 201 illustrates two modes of operation, the first mode of operation is an initial mode 300 and the second mode of operation is a normal mode 500 during which there is normal conversion of power. At the beginning of initial mode 300, current limiting (step 400) typically limits the DC current output of each electronic module 102. The limited DC current output of each module 102, prevents for example, the situation where the entire load 150 current (h) is being supplied by a single string 120 or some strings are not providing any of the load current (h).

An initial code stored in memory 110 modulates (step 202) a variation of voltage or current on the input of load 150 to produce an initial signal. The initial signal is transmitted (step 203) from inverter module 104. Direct electrical variation of current on the input of load 150 may be achieved by using control line 114 to vary the input impedance of load 150 according to a code previously stored in memory 110. The frequency of the transmitted control signal may be between 1 Hz and 100 Hz or may also be at higher frequencies.

The initial signal transmitted (step 203) from inverter module 104 is then received (step 205) by electronic module 102. The initial signal is sensed and a measure of the signal strength of the initial signal may be performed. The measure of the signal strength of the initial signal may be stored in memory 130. The initial signal is demodulated and/or decoded (step 206) by transceiver 108 and the initial code corresponding to inverter module 104 is obtained from the demodulated output voltage. The initial code corresponding to inverter module 104 is stored (step 207) in memory 130.

In order to end initial mode of operation in decision box 209, a control signal is typically modulated (step 210) and transmitted (step 211) from inverter module. The control signal is received (step 213) and demodulated and/or decoded (step 214) by photovoltaic module 102 and a control code is stored. In decision box 215, the control code is compared with the initial code and if the comparison is positive, i.e. the control code is the same as the initial code, then electronic module 102 validates the command as coming from inverter module 104 with which photovoltaic module 102 is paired and not a control signal as crosstalk from another inverter module in the same photovoltaic generation field. In decision box 215, if the initial code positively compares with the control code normal conversion of power (step 502) commences.

An MPP circuit performs maximum peak power tracking (MPPT), in which the current extracted from a photovoltaic panel provides the maximum average power (i.e., if more current is extracted, the average voltage from the panel starts to drop, thus lowering the harvested power). It continuously monitors the current and voltage provided by the panel and uses one of several well-known MPP tracking algorithms to maintain maximum possible power output. Maximum peak power tracking (MPPT) continuously tracks the PV's power output to determine an optimal working point for maximum power.

As an example, of a control signal is a keep alive signal 550. When keep alive signal is encoded with a valid control code then photovoltaic module 102 maintains normal conversion of power. Otherwise, if keep alive signal 550 is not encoded with a valid control signal, such as if the signal received is "pick-up" or cross talk from another inverter in the photovoltaic field then in decision box 215 keep alive signal 550 is not validated and photovoltaic module 102 enters initial mode 400 which is typically a safety or current limited mode of operation until a valid keep alive signal 550 signal is received to enter normal operation 500.

There may be multiple possible frequencies for communication, and during pairing (initial mode 300) the initial signal transmitted to and received by photovoltaic module 102 may specify to photovoltaic module 102 which frequencies to listen to and to transmit on.

Signal strength may be also be used alternatively or in addition to invalidate a control signal or at least set an alert condition. Typically, signal strength variation as measured by photovoltaic module 102 from a transmission from inverter module 104 is not expected to vary more than a threshold ±3 decibel (dB). A variation of signal strength more between the initial transmission (step 203) and the control transmission (step 211) greater than the threshold may set an alarm condition or be used alternatively or in addition to invalidate a control signal in decision box 215 as being sourced by an unpaired inverter module 104.

Figure 1B:
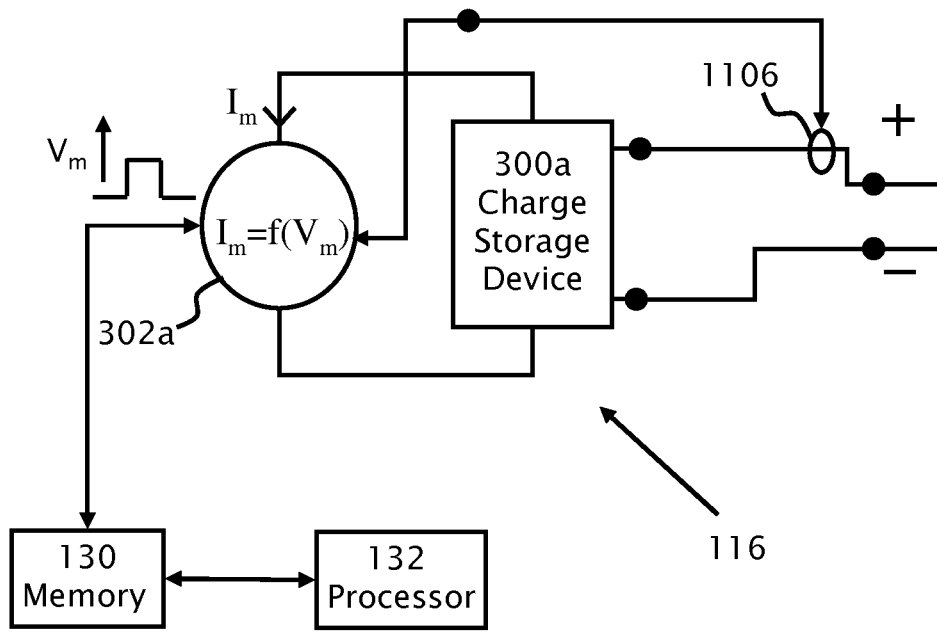
FIG. 1b shows further details of a transceiver attached to the output of photovoltaic modules in the power generation circuit shown in FIG. 1a according to an embodiment of the present invention.

Reference is now also made to FIG. 1*b* which illustrates schematically further details of power source 116, according to an embodiment of the present invention. The DC output of power source 116 is connected to a charge storage device 300*a*. Charge storage device 300*a* has a direct current (DC) output which supplies power to a modulator/demodulator unit 302*a*. A transducer/sensor 1106 attached to the output of module 102 connects to modulator/demodulator 302*a*.

Modulator/demodulator unit 302*a* has a bi-directional connection to memory 130 and/or processor 132 for storing a (de)modulation voltage $V_m$ or a code decoded from an input signal. The DC output of charge storage device 300*a* may provide processor 132 and memory 130 with DC power. Charge storage device 300*a* is typically a battery or a capacitor which is charged via the DC output of module 102 during daytime operation of power circuit 101. The charge stored in storage device 300*a* during daytime may be used at nighttime.

Figure 1E:
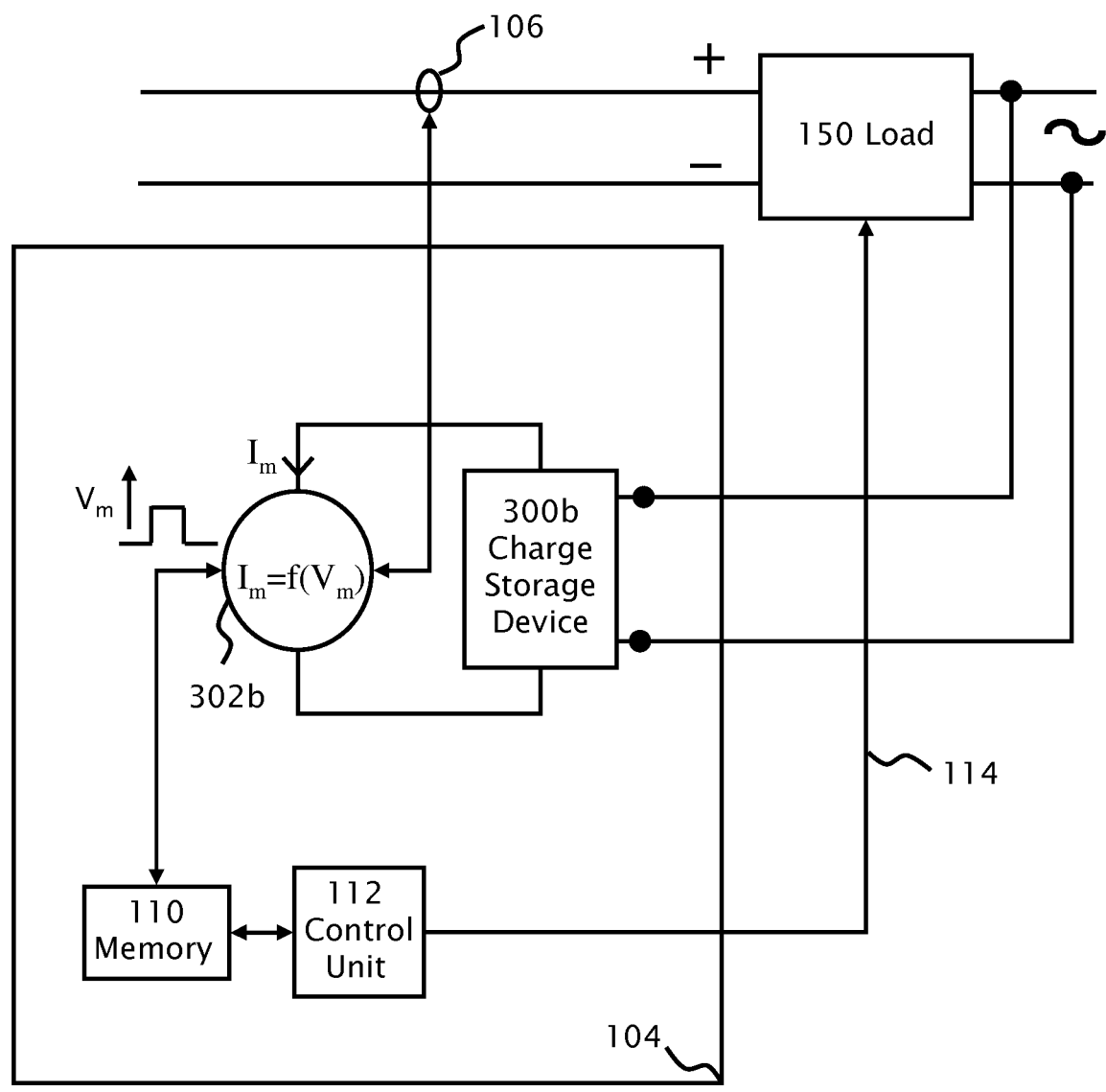
FIG. 1e shows further details of a control and communications unit attached to the load shown in FIG. 1a, according to features of the present invention.

Reference is now made to FIG. 1*e* which shows further details of inverter module 104 attached to load 150 in power generation circuit 101 according to an embodiment of the present invention. The output of load 150 is connected to an AC grid voltage. The AC grid voltage is connected to charge storage device 300*b*. Charge storage device 300*b* is typically a battery or a capacitor which is charged via the rectified grid voltage on the output of load 150 and/or from the DC input to load 150 during daytime operation. Charge storage device 300*b* has a direct current (DC) output which supplies power to modulator/demodulator unit 302*b*. Transducer 106, connected at the input of load 150, is connected to modulator/demodulator unit 302*b*. Modulator/demodulator unit 302*b* also has a connection to memory 110 or control unit 112. Control unit 112 is attached to memory 110. Control unit 112 is attached to load 150 via control line 114. The DC output of charge storage device 300*b* may provide control unit 112 and memory 110 with DC power.

Reference is now made to FIG. 1*e* which shows a method 103 used to operate transceiver 108/118 according to different aspects of the present invention.

The transmission of the control signal from inverter module 104 is preferably performed by transceiver 118 with method 103. The transmission of telemetries by photovoltaic module 102 is by transceiver 108 with method 103. When photovoltaic module 102 sends telemetries, a source identification code identifying the photovoltaic module 102 as the source and a destination identification code identifying inverter module 104 as the destination may be included in the communication signal.

When transceiver 108/118 is operating as a transmitter, modulator 302*a*/302*b* causes a modulated signal to be superimposed (step 107) on to the DC power line. Modulator 302*a*/302*b* has an input voltage ($V_m$) which causes a current ($I_m$) to be drawn (step 105) from charge storage device 300*a*/300*b* which in turn draws current from the output of module 102 and from the input of load 150 respectively. The current drawn from charge storage device 300*a*/300*b* is therefore a function of the input voltage i.e. modulating voltage ($V_m$). The superposition (step 107) of the modulated signal on to the DC power line is preferably via transducer 106/1106 or by a direct electrical connection (i.e. via a coupling capacitor) to the DC power line.

According to an exemplary embodiment of the present invention, the transmission of the control signal from inverter module 104 is optionally performed without the use of transducer 106. Instead the modulated control signal is made by altering the input impedance of load 150 according to a code in memory 110 via control line 114. The variation of the input impedance of load 150 causes the DC input current of load 150 (drawn from modules 102) to vary by virtue of Ohm's law. The drawn current from modules 102 is sensed by transducer 1106 and de-modulated by transceiver 108 in module 102.

Reference is now made to FIG. 1*d* which shows a method 109 used to operate transceiver 108/118 according to an aspect of the present invention. The reception of telemetries by inverter module 104 is performed by transceiver 118 with method 109. The reception of the control signal from inverter module 104 by photovoltaic modules 102 is performed by transceiver 108 with method 109. When transceiver 108/118 is operating as a receiver a signal present on the DC power line is extracted (step 111) from the DC power line via transducer 106/1106 or by direct electrical connection (i.e. via coupling capacitor). Demodulator 302*a*/302*b* de-modulates the sensed signal present on the DC power line. In demodulation, the signal sensed and extracted (step 111) from the DC power line may vary (step 113) the current ($I_m$) drawn from charge storage device 300*a*/300*b* which in turn draws current from the output of module 102 and from the input of load 150 respectively to produce a demodulated output voltage $V_m$. The demodulated output voltage ($V_m$) is a function of drawn current $I_m$.

While the invention has been described with respect to a limited number of embodiments, it will be appreciated that many variations, modifications and other applications of the invention may be made.

The invention claimed is:

1. A system comprising:
   a photovoltaic (PV) module coupled to a photovoltaic (PV) generator; and
   a communication module,
   wherein the communication module is configured to send an initial signal to the PV module, and the PV module is configured to:
   retrieve an initial code from the initial signal;
   pair the PV module to the communication module;
   receive a control signal;
   retrieve a control code from the control signal;
   compare the control code to the initial code;

determine, based on the comparison, that the control signal is valid; and operate, based on a determination that the control signal is valid, the PV module to enable output power from the PV generator according to a maximum power point tracking algorithm.

2. The system of claim 1, wherein the PV module is configured to exclude, based on the paired PV module and communication module, the PV module from validating commands signaled by devices other than the communication module.

3. The system of claim 1, wherein the initial signal is a wireless signal.

4. The system of claim 1, wherein the initial signal is a signal modulated over a power line coupled to an output of the PV module.

5. The system of claim 1, wherein the initial signal comprises a source identification code identifying the communication module as a source of the initial signal.

6. The system of claim 1, wherein the PV module is configured to determine, based on the comparison, that the control signal is valid by validating, based on the control code matching a source identification code of the initial signal, the control code retrieved from the control signal.

7. The system of claim 1, wherein the control signal comprises a keep-alive signal.

8. The system of claim 1, wherein the PV module is configured to compare the control code to the initial code by comparing a signal strength of the control signal to a signal strength of the initial signal.

9. The system of claim 1, wherein the PV module is configured to output power from the PV generator by converting power, using maximum peak power tracking, from the PV generator to an output of the PV module.

10. The system of claim 1, wherein the communication module is coupled to a load via a control line.

11. The system of claim 1, wherein the communication module is integrated in a direct current (DC)-to-alternating current (AC) converter.

12. A method comprising:

operating a photovoltaic (PV) module in an initial mode;

receiving a control signal from a communication module;

determining whether the communication module is paired to the PV module; and based on the determining and the control signal, determining whether to operate the PV module in a power production mode, wherein the power production mode comprises enabling transfer of power from an input of the PV module to an output of the PV module according to a maximum power point tracking algorithm.

13. The method of claim 12, wherein the operating the PV module in the initial mode is for a period of time, and wherein the method further comprises, based on a determination that the communication module is not paired to the PV module, operating the PV module in the initial mode for another period of time.

14. The method of claim 12, wherein the power production mode comprises operating a direct current (DC)-to-DC converter to convert power from an input of the PV module to an output of the PV module.

15. A method comprising:

receiving, by a photovoltaic (PV) module coupled to a photovoltaic (PV) generator and from a communication module, an initial signal;

retrieving an initial code from the initial signal;

pairing the PV module to the communication module;

receiving, by the PV module, a control signal;

retrieving a control code from the control signal;

comparing the control code to the initial code;

determining, based on the comparing, that the control signal is invalid; and operating, based on the determining that the control signal is invalid, the PV module in a safety mode of operation, wherein the safety mode of operation comprises a current limited mode of operation or a voltage limited mode of operation.

16. The method of claim 15, wherein the determining comprises, based on a determination that the comparing is not resulting in a positive comparison, determining that the control signal is invalid.

17. The method of claim 15, wherein the determining comprises setting an alert condition.

18. The method of claim 15, wherein the determining comprises invalidating, based on the control code mismatching a source identification code of the initial signal, the control code retrieved from the control signal.

19. The method of claim 15, further comprising:

excluding, based on the pairing, the PV module from validating commands signaled by devices other than the communication module.

20. The method of claim 15, wherein the receiving the initial signal comprises receiving a wireless signal.

21. The method of claim 15, wherein the receiving the initial signal comprises receiving a signal modulated over a power line coupled to an output of the PV module.

22. The method of claim 15, wherein the receiving the initial signal comprises receiving a source identification code identifying the communication module as a source of the initial signal.

23. The method of claim 15, wherein the control signal comprises a keep-alive signal.

24. The method of claim 15, wherein the comparing the control code to the initial code comprises comparing a signal strength of the control signal to a signal strength of the initial signal.

25. The method of claim 15, wherein the communication module is coupled to a load via a control line.

26. The method of claim 15, wherein the communication module is integrated in a direct current (DC)-to-alternating current (AC) converter.

27. A method comprising:

receiving, by a photovoltaic (PV) module coupled to a photovoltaic (PV) generator and from a communication module, an initial signal;

retrieving an initial code from the initial signal;

pairing the PV module to the communication module;

receiving, by the PV module, a control signal;

retrieving a control code from the control signal;

comparing the control code to the initial code;

determining, based on the comparing, that the control signal is valid; and enabling, based on the determining that the control signal is valid, the PV module to output power from the PV generator according to maximum power point tracking.

28. An apparatus comprising:

a photovoltaic (PV) generator configured to provide electrical power on an output;

a communications device; and a processor configured to:

limit the electrical power provided from the output of the PV generator;

receive an initial signal through the communications device;

receive a control signal through the communications device;

validate a control code received in the control signal against an initial code received in the initial signal; and commence, based on validation of the control code, generation of power on the output of the PV generator according to maximum power point tracking.

\* \* \* \* \*